United States Patent
Lin et al.

(10) Patent No.: US 9,318,404 B2
(45) Date of Patent: Apr. 19, 2016

(54) SEMICONDUCTOR DEVICE AND METHOD OF FORMING STRESS RELIEVING VIAS FOR IMPROVED FAN-OUT WLCSP PACKAGE

(71) Applicant: STATS ChipPAC, Ltd., Singapore (SG)

(72) Inventors: Yaojian Lin, Singapore (SG); Pandi Chelvam Marimuthu, Singapore (SG); Kang Chen, Singapore (SG); Yu Gu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 131 days.

(21) Appl. No.: 13/759,911

(22) Filed: Feb. 5, 2013

(65) Prior Publication Data
US 2014/0217597 A1    Aug. 7, 2014

(51) Int. Cl.
| | |
|---|---|
| *H01L 23/31* | (2006.01) |
| *H01L 21/56* | (2006.01) |
| *H01L 23/00* | (2006.01) |
| *H01L 23/538* | (2006.01) |
| *H01L 23/36* | (2006.01) |
| *H01L 23/498* | (2006.01) |

(52) U.S. Cl.
CPC .......... *H01L 23/3128* (2013.01); *H01L 21/561* (2013.01); *H01L 21/565* (2013.01); *H01L 21/568* (2013.01); *H01L 23/3121* (2013.01); *H01L 23/36* (2013.01); *H01L 23/49816* (2013.01); *H01L 23/49822* (2013.01); *H01L 23/49894* (2013.01); *H01L 23/5389* (2013.01); *H01L 24/19* (2013.01); *H01L 24/97* (2013.01); *H01L 23/3171* (2013.01); *H01L 23/562* (2013.01); *H01L 2224/16225* (2013.01); *H01L 2224/48091* (2013.01); *H01L 2224/73265* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/1815* (2013.01); *H01L 2924/351* (2013.01); *H01L 2924/3511* (2013.01)

(58) Field of Classification Search
CPC ......... H01L 21/56; H01L 23/31; H01L 24/19; H01L 24/97; H01L 23/49894; H01L 23/49822; H01L 23/49816; H01L 23/36; H01L 23/5389; H01L 23/568; H01L 21/565; H01L 23/3121; H01L 23/3128; H01L 21/561
USPC .......................................... 257/773; 438/127
See application file for complete search history.

(56) References Cited

U.S. PATENT DOCUMENTS

| | | |
|---|---|---|
| 8,288,209 B1 | 10/2012 | Chi et al. |
| 2010/0052135 A1* | 3/2010 | Shim et al. ............ 257/686 |

(Continued)

*Primary Examiner* — Walter H Swanson
(74) *Attorney, Agent, or Firm* — Robert D. Atkins; Patent Law Group: Atkins and Associates, P.C.

(57) ABSTRACT

A semiconductor device includes a semiconductor die. An encapsulant is disposed around the semiconductor die to form a peripheral area. An interconnect structure is formed over a first surface of the semiconductor die and encapsulant. A plurality of vias is formed partially through the peripheral area of the encapsulant and offset from the semiconductor die. A portion of the encapsulant is disposed over a second surface of the semiconductor die opposite the first surface. The plurality of vias comprises a depth greater than a thickness of the portion of the encapsulant. A first portion of the plurality of vias is formed in a row offset from a side of the semiconductor die. A second portion of the plurality of vias is formed as an array of vias offset from a corner of the semiconductor die. A repair material disposed within the plurality of vias.

21 Claims, 20 Drawing Sheets

(56) References Cited

U.S. PATENT DOCUMENTS

| | | |
|---|---|---|
| 2012/0139120 A1 | 6/2012 | Chow et al. |
| 2012/0161316 A1* | 6/2012 | Gonzalez et al. ............. 257/738 |
| 2012/0273957 A1* | 11/2012 | Meyer ........................... 257/773 |
| 2012/0286407 A1* | 11/2012 | Choi et al. .................... 257/670 |
| 2013/0147054 A1 | 6/2013 | Lin et al. |

* cited by examiner

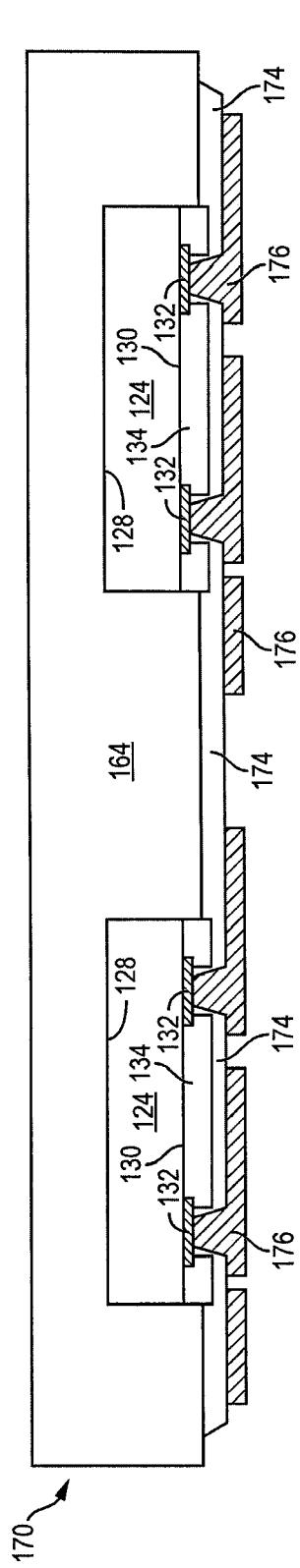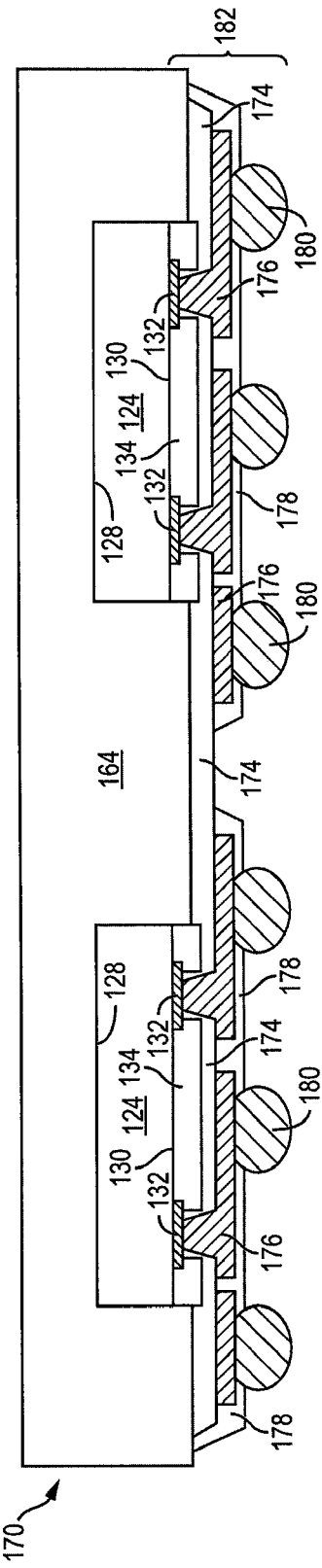

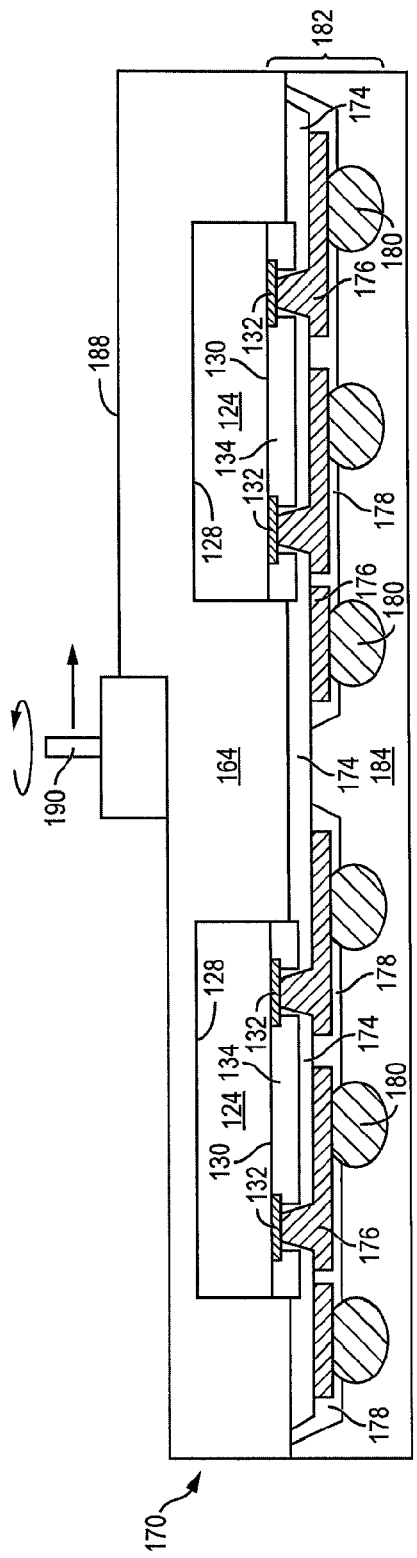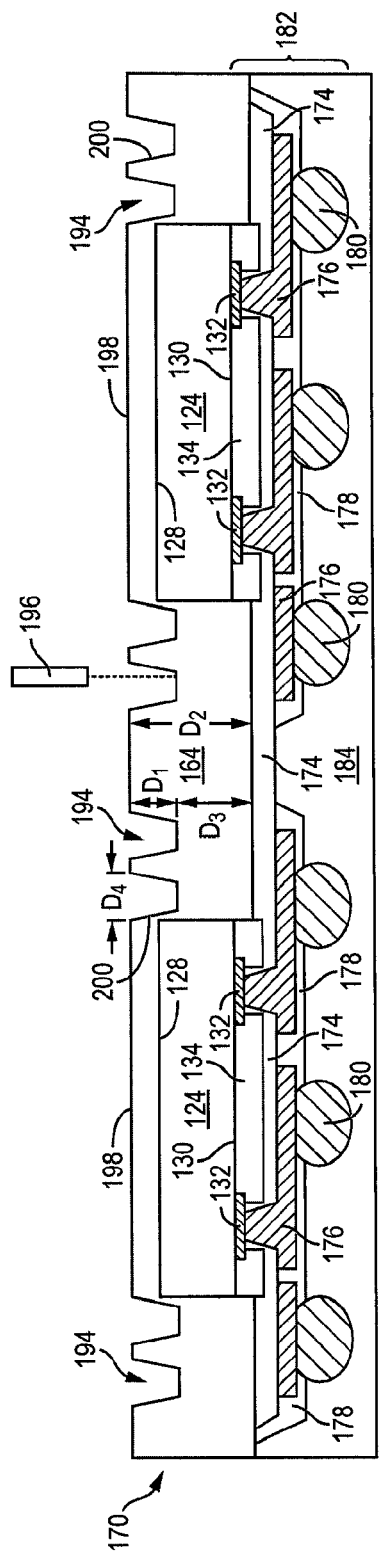

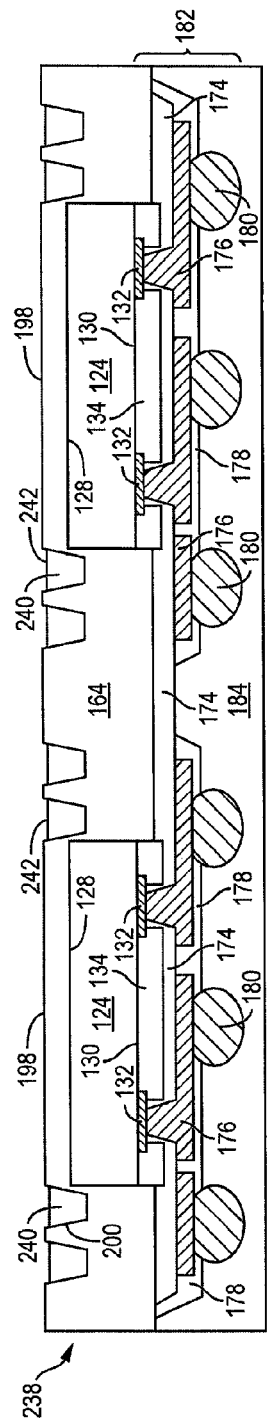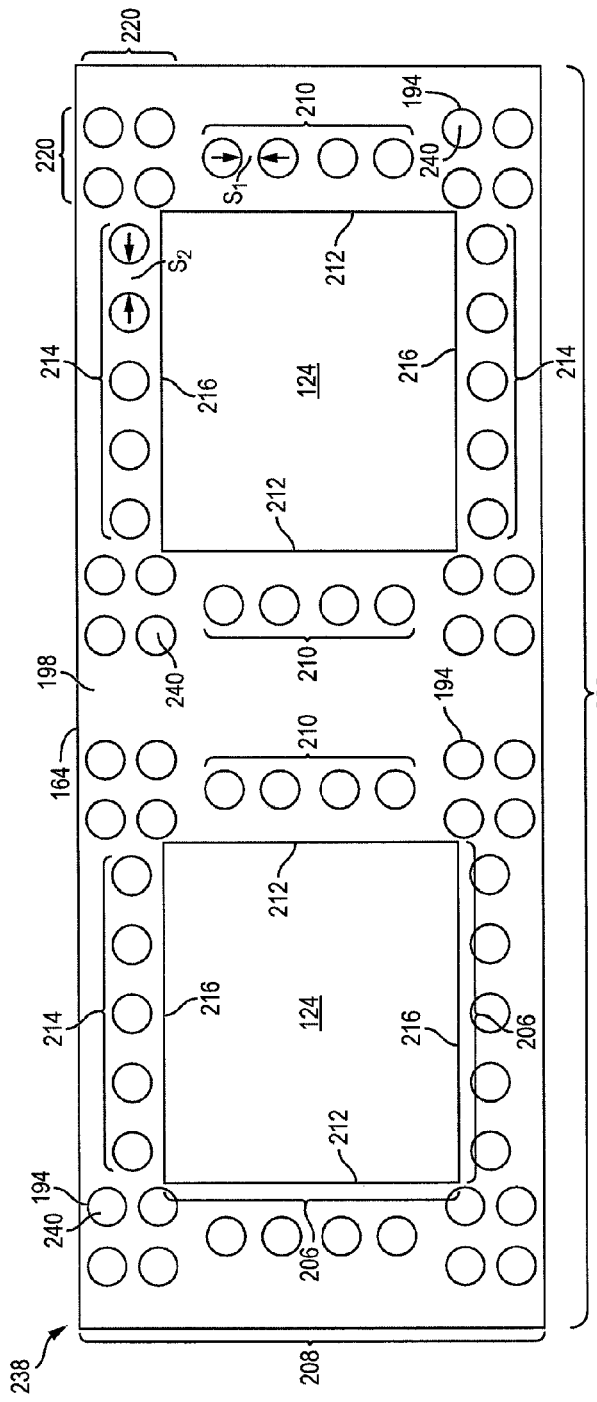
FIG. 6a
FIG. 6b

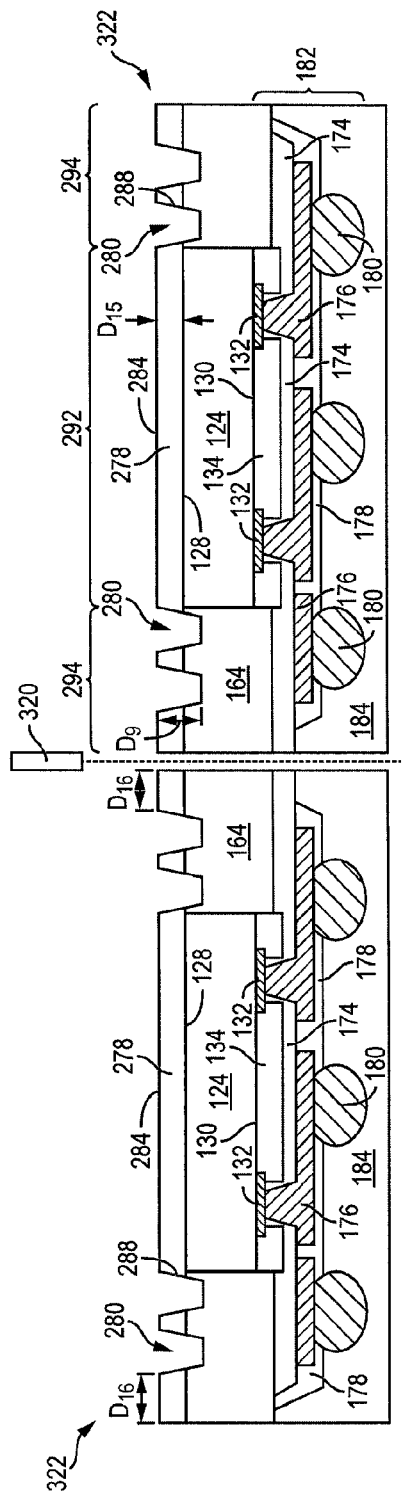
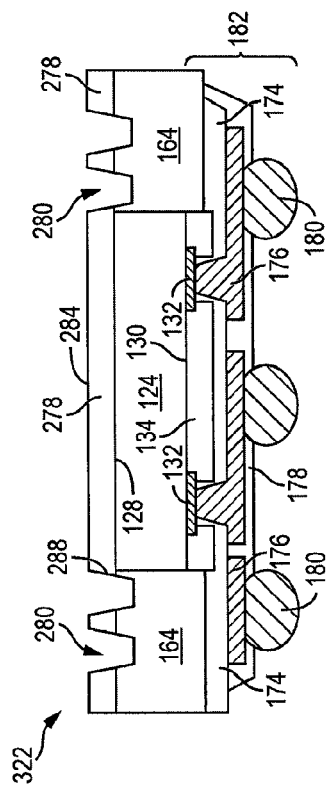
FIG. 9f
FIG. 10

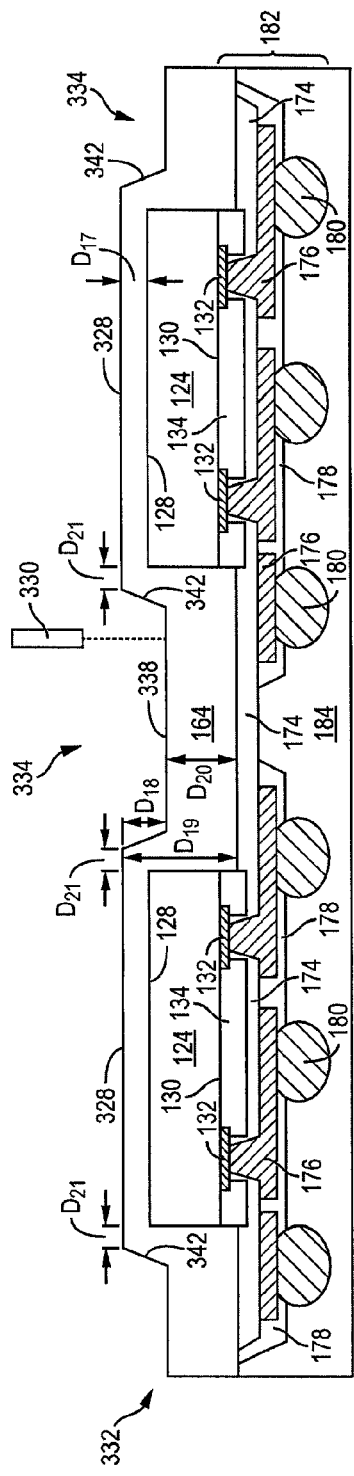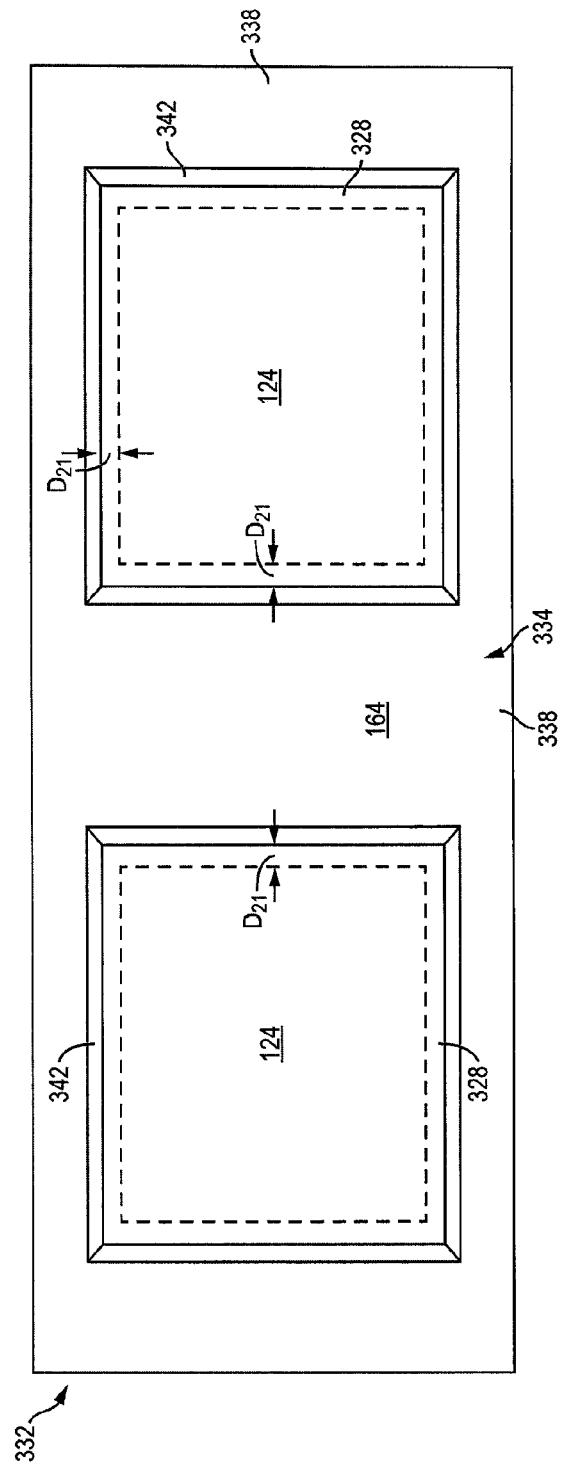
FIG. 11a
FIG. 11b

SEMICONDUCTOR DEVICE AND METHOD OF FORMING STRESS RELIEVING VIAS FOR IMPROVED FAN-OUT WLCSP PACKAGE

FIELD OF THE INVENTION

The present invention relates in general to semiconductor devices and, more particularly, to a semiconductor device and method of forming stress relieving vias around a semiconductor die for improved temperature cycling on board (TCoB) performance of fan-out wafer level chip scale packages (fo-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

When reducing package size for fo-WLCSPs, a reduction in package size often leads to reductions in package performance during TCoB tests. One approach for improving performance of fo-WLCSPs during TCoB testing is to select or change the coefficients of thermal expansion (CTEs) for the major body build-of-material (BOM) of the fo-WLCSPs. However, flexibility in changing major body BOMB of the fo-WLCSPs is limited, especially before completely forming package interconnect structures including redistribution layers (RDLs) and bumps is complete. Flexibility in changing major body BOMB is limited because of process requirements that are necessary for controlling substrate warpage and for maintaining integrity of components during wafer handling and substrate processing.

SUMMARY OF THE INVENTION

A need exists for a semiconductor device and method of forming stress relieving vias around a semiconductor die for improved TCoB performance of fo-WLCSPs. Accordingly, in one embodiment, the present invention is a semiconductor device including a semiconductor die. An encapsulant is disposed around the semiconductor die to form a peripheral area. An interconnect structure is formed over a first surface of the semiconductor die and encapsulant. A plurality of vias is formed partially through the peripheral area of the encapsulant and offset from the semiconductor die.

In another embodiment, the present invention is a semiconductor device including a semiconductor die. An encapsulant is disposed around the semiconductor die to form a peripheral area. A via is formed partially through the peripheral area of the encapsulant and offset from the semiconductor die.

In another embodiment, the present invention is a semiconductor device including a semiconductor die. An encapsulant is disposed around the semiconductor die. A via is formed in the encapsulant and offset from the semiconductor die.

In another embodiment, the present invention is a method of making a semiconductor device including the steps of providing a semiconductor die, disposing an encapsulant around the semiconductor die to form a peripheral area, and forming a via partially through the peripheral area and offset from the semiconductor die.

BRIEF DESCRIPTION OF THE DRAWINGS

FIGS. 4a-4k illustrate a process of forming a thin fo-WLCSP including stress relieving vias around a semiconductor die;

FIGS. 6a-6d illustrate a process of forming a thin fo-WLCSP including stress relieving vias around a semiconductor die and a repair material;

FIGS. 9a-9f illustrate a process of forming a thin fo-WLCSP including stress relieving vias around a semiconductor die and a support layer;

FIG. 10 illustrates an embodiment of a thin fo-WLCSP including stress relieving vias around a semiconductor die and a support layer;

FIGS. 11a-11c illustrate a process of forming a thin fo-WLCSP including a recessed area disposed around a semiconductor die and a support layer.

DETAILED DESCRIPTION OF THE DRAWINGS

Figure 1:
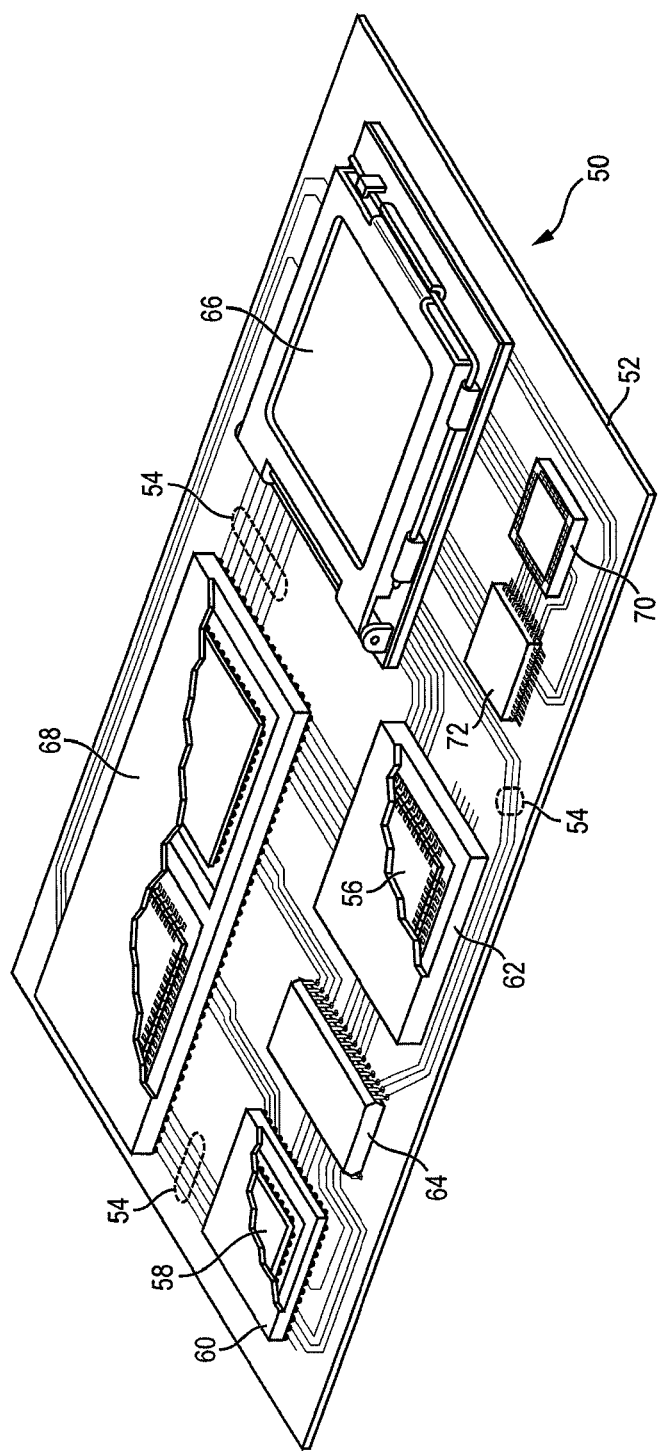
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes.

The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
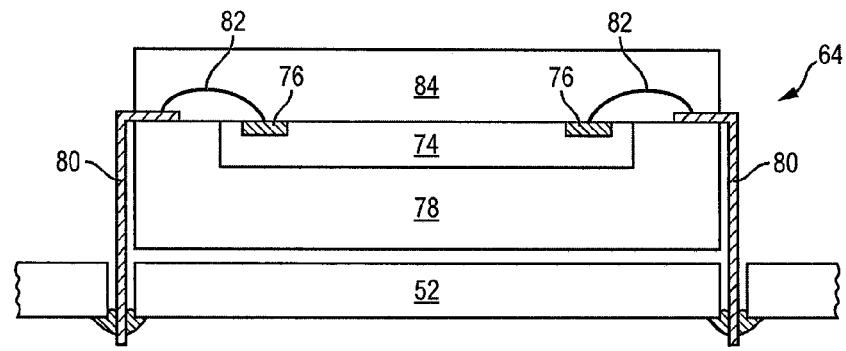
FIGS. 2*a*-2*c* illustrate further detail of the representative semiconductor packages mounted to the PCB.
Figure 2B:
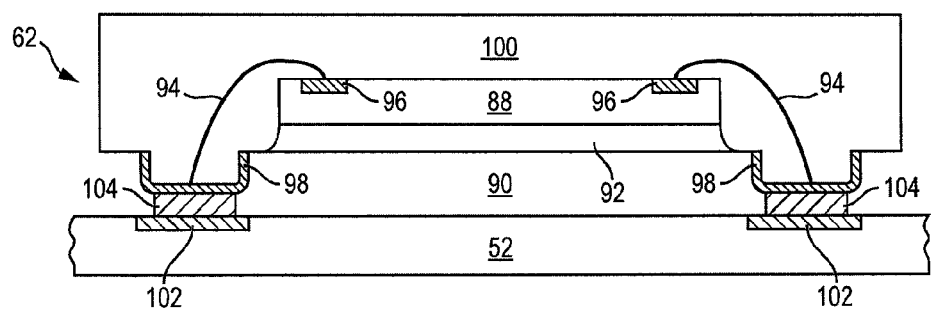
Figure 2C:
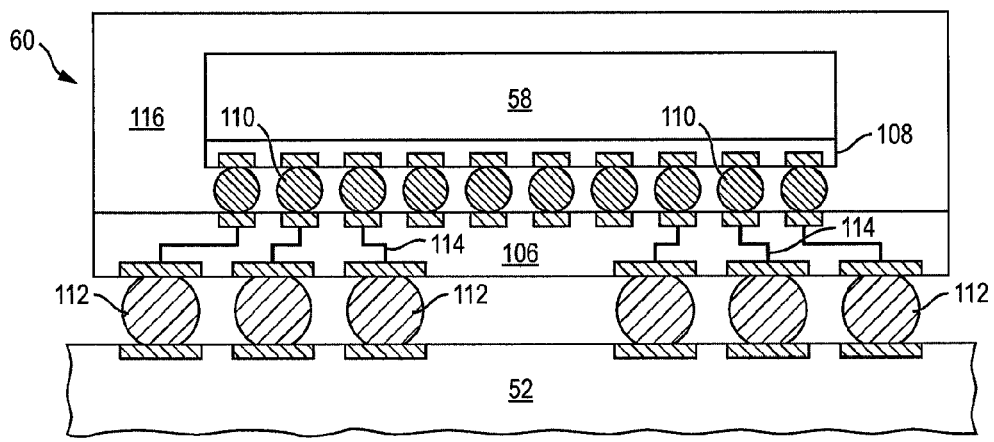

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
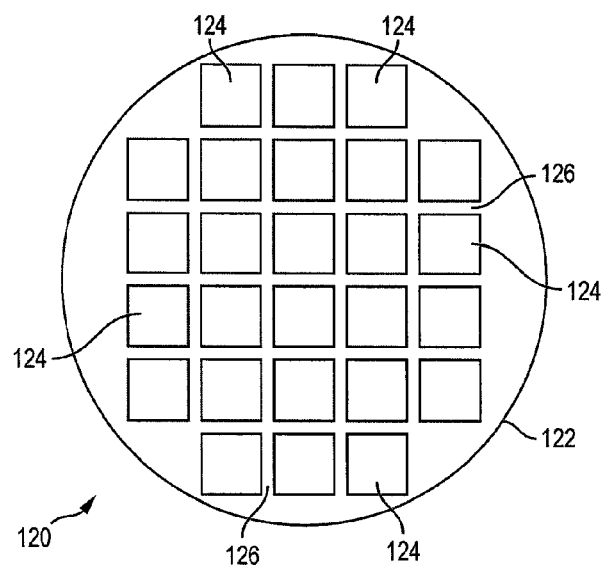
FIGS. 3*a*-3*c* illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into strips of semiconductor die or individual semiconductor die 124.

Figure 3B:
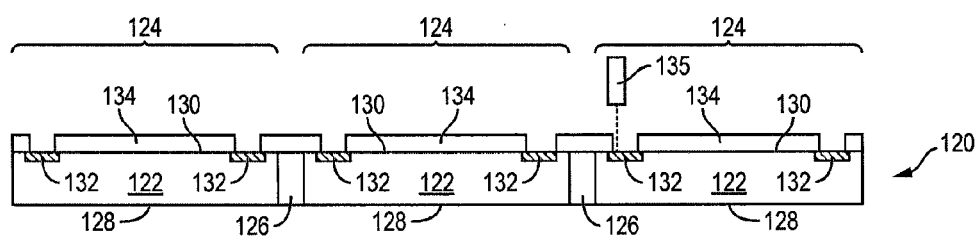

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is conformally applied to active surface 130 and conductive layer 132 using PVD, CVD, screen printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 includes a first surface that follows a contour of active surface 130 and conductive layer 132, and a second surface opposite the first surface that is substantially planar. A portion of insulating layer 134 is removed by laser 135 using laser direct ablation (LDA) or other suitable process to form openings over conductive layer 132.

Figure 3C:
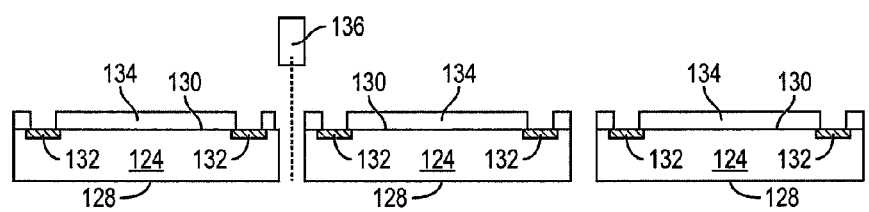

In FIG. 3c, semiconductor wafer 120 is singulated through saw street 126 using a saw blade or laser cutting tool 136 into individual semiconductor die 124.

Figure 4A:
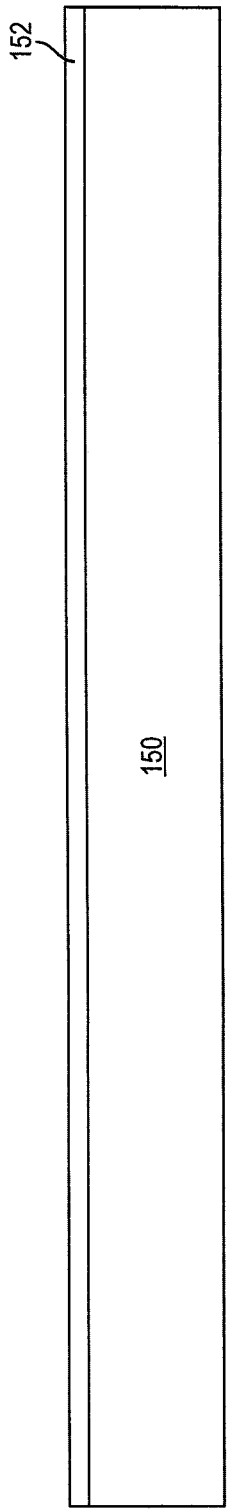

FIGS. 4a-4j illustrate, in relation to FIGS. 1 and 2a-2c, a semiconductor device and method of forming stress relieving vias around a semiconductor die for improved TCoB performance of fo-WLCSPs. FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Figure 4B:
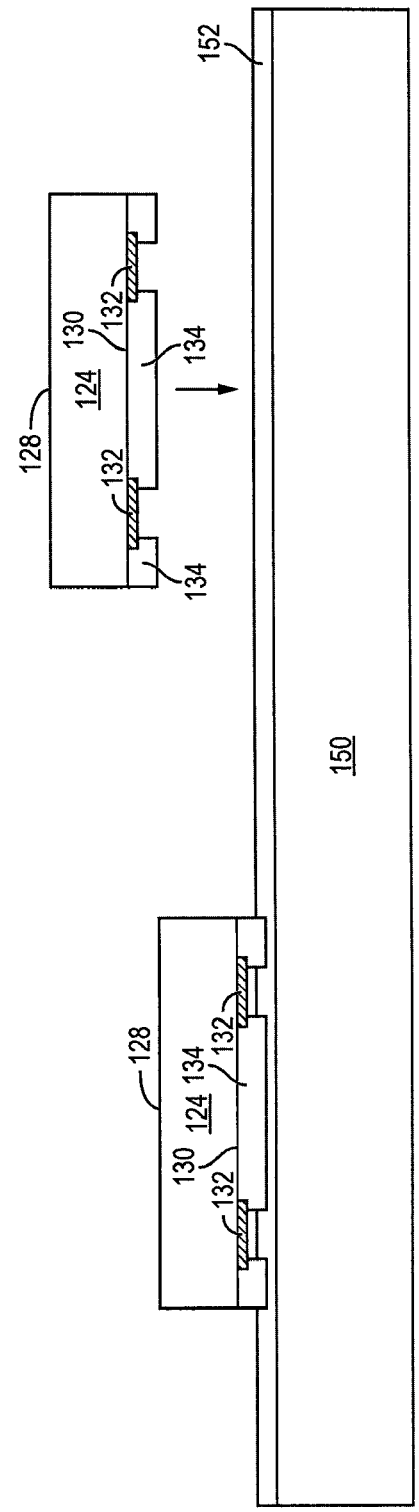

In FIG. 4b, semiconductor die 124 from FIG. 3c are mounted to interface layer 152 and over carrier 150 using, for example, a pick and place operation with active surface 130 oriented toward the carrier. Semiconductor die 124 are pressed into interface layer 152 such that a portion of insulating layer 134 or semiconductor die 124 is disposed within, and surrounded by, the interface layer.

Figure 4C:
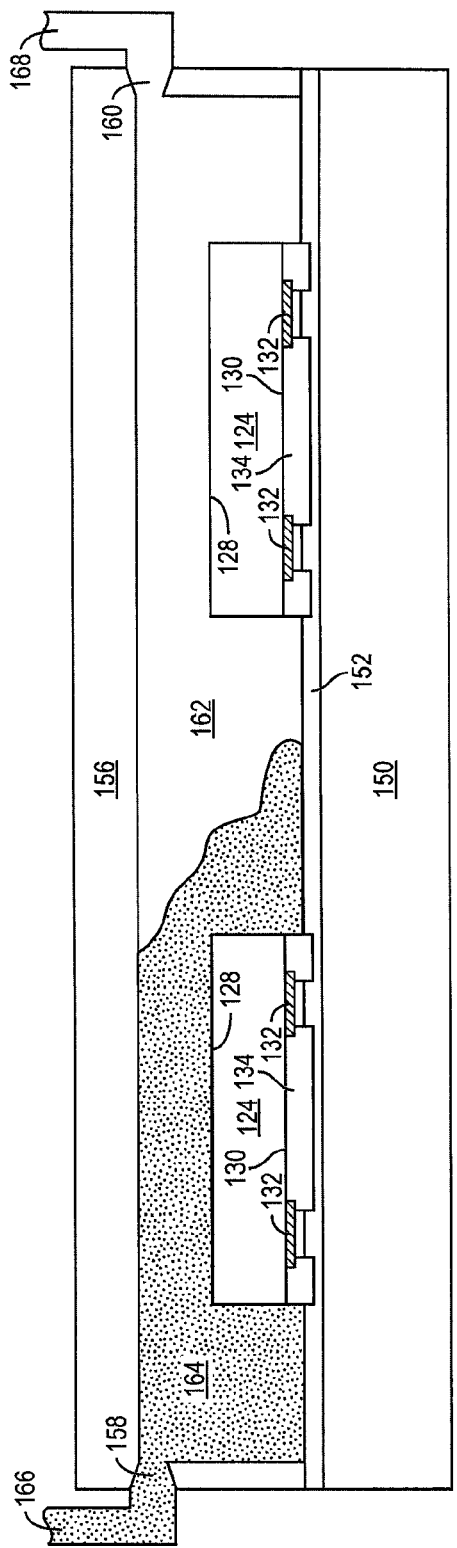

In FIG. 4c, carrier 150 and semiconductor die 124 are placed in chase mold 156 having a plurality of inlets 158 and 160, and a cavity 162. Carrier 150 is placed into chase mold 156 so that semiconductor die 124 are disposed within cavity 162. A volume of encapsulant or molding compound 164 is injected from dispenser 166 under an elevated temperature and pressure through inlet 158 into cavity 162, over and around semiconductor die 124, and over carrier 150. Inlet 160 can be an exhaust port with optional vacuum assist 168 for excess encapsulant 164. Encapsulant 164 can be a polymer composite material, such as epoxy resin with filler, epoxy acrylate with filler, or polymer with proper filler. Encapsulant 164 is non-conductive, provides physical support, and environmentally protects semiconductor die 124 from external elements and contaminants. A volume of encapsulant 164 is measured according to the space requirements of cavity 162 less the area occupied by semiconductor die 124. Encapsulant 164 is evenly dispersed and uniformly distributed under an elevated temperature within cavity 162 and around semiconductor die 124.

Figure 4D:
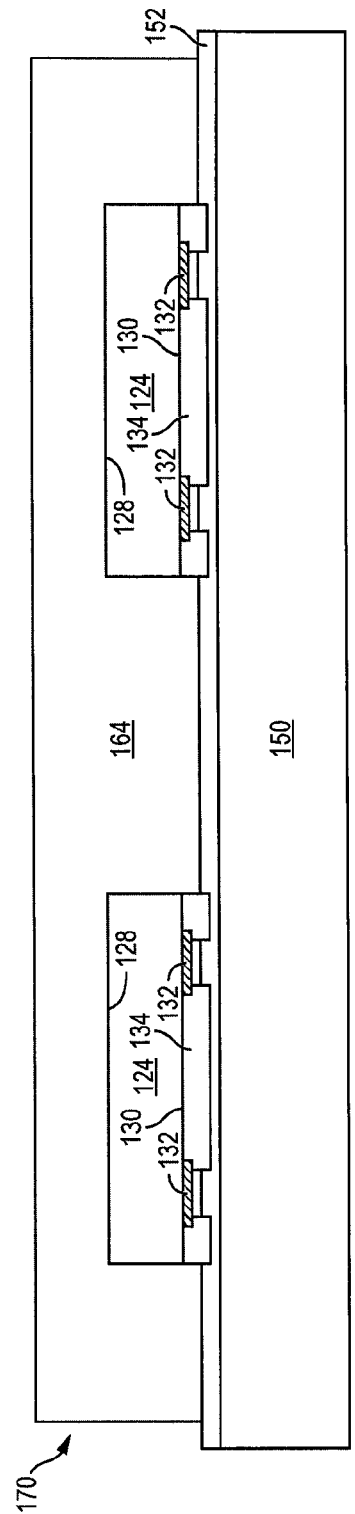

FIG. 4d shows composite substrate or reconstituted wafer 170 covered by encapsulant 164. Encapsulant 164 can be formed as a portion of composite substrate 170 in a chase mold as depicted in FIG. 4c, and as recited in the supporting text. Alternatively, encapsulant 164 can be formed as a portion of composite substrate 170 using a paste printing, compressive molding, transfer molding, liquid encapsulant molding, vacuum lamination, or other suitable applicator. In one embodiment, encapsulant 164 is dispensed at a center of carrier 150 or over an entirety of the carrier using a nozzle dispense or screen paste printing process, which is followed by compressive molding or high pressure oven curing. Encapsulant 164 is formed over back surface 128 of semiconductor die 124, and can be thinned in a subsequent backgrinding step. Encapsulant 164 can also be deposited such that the encapsulant is coplanar with back surface 128 and does not cover the back surface. In either case, encapsulant 164 facilitates the subsequent formation of a fan-out build-up interconnect structure over encapsulant 164 and semiconductor die 124.

In FIG. 4e, carrier 150 and interface layer 152 are removed from composite substrate 170 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and encapsulant 164.

FIG. 4e also shows a first portion of a fan-out build-up interconnect structure or RDL is formed by the deposition and patterning of insulating or passivation layer 174. Insulating layer 174 is conformally applied to, and has a first surface that follows the contours of, encapsulant 164, insulating layer 134, semiconductor die 124, and conductive layer 132. Insulating layer 174 has a second planar surface opposite the first surface. Insulating layer 174 contains one or more layers of $SiO_2$, $Si_3N_4$, SiON, $Ta_2O_5$, $Al_2O_3$, or other material having similar insulating and structural properties. Insulating layer 174 is deposited using PVD, CVD, printing, spin coating, spray coating, sintering, thermal oxidation, or other suitable process. A portion of insulating layer 174 is removed by an exposure or development process, LDA, etching, or other suitable process to form openings over conductive layer 132. The openings expose conductive layer 132 of semiconductor die 124 for subsequent electrical interconnect.

An electrically conductive layer 176 is patterned and deposited over insulating layer 174, over semiconductor die 124, and disposed within the openings in insulating layer 174 to fill the openings and contact conductive layer 132. Conductive layer 176 is one or more layers, including seed layers, that include Al, Cu, Sn, Ni, Au, Ag, titanium (Ti)/Cu, titanium tungsten (TiW)/Cu, Ti/nickel vanadium (NiV)/Cu, TiW/NiV/Cu, or other suitable electrically conductive material. The deposition of conductive layer 176 uses PVD, CVD, electrolytic plating, electroless plating, or other suitable process. In one embodiment, the deposition of conductive layer 176 includes selective plating with a seed layer and lithography. Conductive layer 176 operates as an RDL to fan-out and extend electrical connection from semiconductor die 124 to points external to semiconductor die 124.

In FIG. 4f, an insulating or passivation layer 178 is conformally applied to, and follows the contours of, insulating layer 174 and conductive layer 176. Insulating layer 178 contains one or more layers of $SiO_2$, $Si_3N_4$, SiON, $Ta_2O_5$, $Al_2O_3$, or other material having similar insulating and structural properties. Insulating layer 178 is deposited using PVD, CVD, printing, spin coating, spray coating, sintering, thermal oxidation, or other suitable process. A portion of insulating layer 178 is removed by an exposure or development process, LDA, etching, or other suitable process to form openings in the insulating layer, which expose portions of conductive layer 176 for subsequent electrical interconnection.

FIG. 4f also shows an electrically conductive bump material is deposited over conductive layer 176 and within the openings in insulating layer 178 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form spherical balls or bumps 180. In some applications, bumps 180 are reflowed a second time to improve electrical contact to conductive layer 176. In one embodiment, bumps 180 are formed over a UBM having a wetting layer, barrier layer, and adhesive layer. The bumps can also be compression bonded or thermocompression bonded to conductive layer 176. Bumps 180 represent one type of interconnect structure that can be formed over conductive layer 176. The interconnect structure can also use bond wires, conductive paste, stud bump, micro bump, or other electrical interconnect.

Taken together, insulating layers 174 and 178, as well as conductive layer 176 and conductive bumps 180 form a build-up interconnect structure 182. The number of insulating and conductive layers included within interconnect structure 182 depends on, and varies with, the complexity of the circuit routing design. Accordingly, interconnect structure 182 can include any number of insulating and conductive layers to facilitate electrical interconnect with respect to semiconductor die 124.

In FIG. 4g, an optional carrier or temporary substrate 184 is disposed over interconnect structure 182. Carrier 184 includes a backgrinding tape, supporting tape, and other carriers containing sacrificial base material such as silicon, polymer, beryllium oxide, glass, or other suitable low-cost, rigid material for structural support. Carrier 184 can include an interface layer, double-sided tape, and openings configured to receive composite substrate 170 and interconnect structure 182. Carrier 184 optionally provides additional support for subsequent processing steps of the semiconductor device as shown in FIGS. 4g-4k. Alternatively, the subsequent processing steps for the semiconductor device are performed without carrier 184, and the additional support required for subsequent processing is provided by other components, such as encapsulant 164. Thus, the process steps described with respect to FIGS. 4g-4k are performed with or without removing carrier 184 and with or without removing surface 188 of encapsulant 164 as described below.

FIG. 4g shows surface 188 of encapsulant 164 opposite interconnect structure 182 undergoes an optional grinding operation with grinder or laser 190 to planarize the surface and reduce a thickness of the encapsulant. A chemical etch or CMP process can also be used to remove mechanical damage resulting from the grinding operation and planarize encapsulant 164. Because the removal of surface 188 of encapsulant 164 is optional, in one embodiment carrier 184 is disposed over interconnect structure 182 without the removal of surface 188 of the encapsulant.

FIG. 4h shows composite substrate 170 and carrier 184 after the optional backgrinding of encapsulant 164 shown in FIG. 4g. A plurality of vias or openings 194 are formed in encapsulant 164 of composite substrate 170 using laser drilling, mechanical drilling, deep reactive ion etching (DRIE), wet/dry etching, or other suitable process. In one embodiment, vias 194 are formed by LDA using laser 196 and include a shape that is circular, square, rectangular, oblong, polygon, star, amorphous, or other suitable shape. Vias 194 are formed through surface 198 at a backside of encapsulant 164 or composite substrate 170 after the composite substrate reaches a thickness equal to a thickness of a final semiconductor package. Vias 194 extend from surface 198 of encapsulant 164 partially, but not completely, through the encapsulant. In other words, vias 194 include a distance or depth D1 that is less than a distance or depth D2 of encapsulant 164. Distance D2 of encapsulant 164 extends from surface 198 to insulating layer 174 of build-up interconnect structure 182. In one embodiment, a ratio of D1:D2 is less than 4:5 such that distance D1 is less than or equal to eighty percent of a distance of D2. When D1 is less than D2, a distance or thickness of encapsulant D3 equal to a difference between D2 and D1 remains between vias 194 and insulating layer 174 or build-up interconnect structure 182. D3 includes a thickness of at least 1 micrometer (μm). Vias 194 include a depth D1 greater than a distance between back surface 128 of semiconductor die 124 and surface 198 of encapsulant 164. Vias 194 further include a diameter or width D4 between via sidewalls 200 in a range of 100-500 μm. Via sidewalls 200 are straight, sloped, or angled such that diameter D4 of the vias 194 is constant along the depth D1 or varies along the depth D1 of the vias.

The formation of vias 194 through surface 198 of encapsulant 164 provides a reduction of stress in composite substrate 170. Stress develops in composite substrate 170 as a result of differences in the CTEs of various materials forming the composite substrate, for example, a CTE of encapsulant 164 and a CTE of semiconductor die 124. Through the formation of vias 194, a reduction of stress in composite substrate 170 occurs without changing the CTEs of individual components of the composite substrate, including major body BOMs. Instead, the reduction of stress in composite substrate 170 results from redistributing stress concentrations throughout the composite substrate by changes in package geometry. The formation of vias 194 redistributes stress in composite substrate 170 to reduce stress in areas of high stress concentration, including at contact pads 132 and bumps 180. Overall package stress and strain are also reduced by a reduction of mass at a backside of composite substrate 170, including at an area outside a footprint of semiconductor die 124 over bumps 180 and opposite interconnect structure 182. Reduction of stress and strain in composite substrate 170 improves package performance during TCoB tests, and improves package performance and reliability.

While the formation of vias 194 improves package performance during TCoB tests without changing CTEs of the tested package or the test board, the performance of packages during TCoB tests was negatively affected by a CTE of the package being less than a CTE of the test board. Accordingly, package performance during TCoB tests is improved by having a package CTE equal, or substantially equal, to a CTE of the TCoB test board. Reducing the difference in CTEs between the packages and test board is accomplished by increasing the CTE of the package or decreasing the CTE of the test board. While formation of vias 194 can actually reduce the overall CTE of the package when the CTE of the encapsulant is higher than a CTE of the package as a whole, other adjustments can be made to package materials to reduce the overall CTE of the package. For example, the CTE of the package can be increased by increasing a CTE of the encapsulant, which is accomplished by reducing a quantity of filler mixed with encapsulant 164 for a fixed volume unit when the filler includes a CTE lower than the CTE of the encapsulant. Thus, changes to both package CTE and package geometry can be incorporated into a single package to improve package performance during TCoB tests, and improve package performance and reliability.

After formation of vias 194, the vias can be left unfilled or void of any additional material. Alternatively, as discussed in greater detail below, a repair material in the form of an ink, paste, or other suitable material is applied in vias 194 to repair damage to encapsulant 164 resulting from the formation of the vias. The repair material can also be formed over surface 198. The reduction of stress in composite substrate 170 resulting from the formation of vias 194 through surface 198 of encapsulant 164 increases package performance and pass rates for packages undergoing TCoB tests. While the challenges of poor performance in TCoB tests vary based on fan-out package design, and are more acute for large packages, package performance during TCoB tests is improved with the formation of vias 194 as described above. The additional cost incurred by the formation of vias 194 is less than, and offset by, the savings realized by increased package quality and reliability resulting from fewer failures during temperature cycling.

Figure 4I:
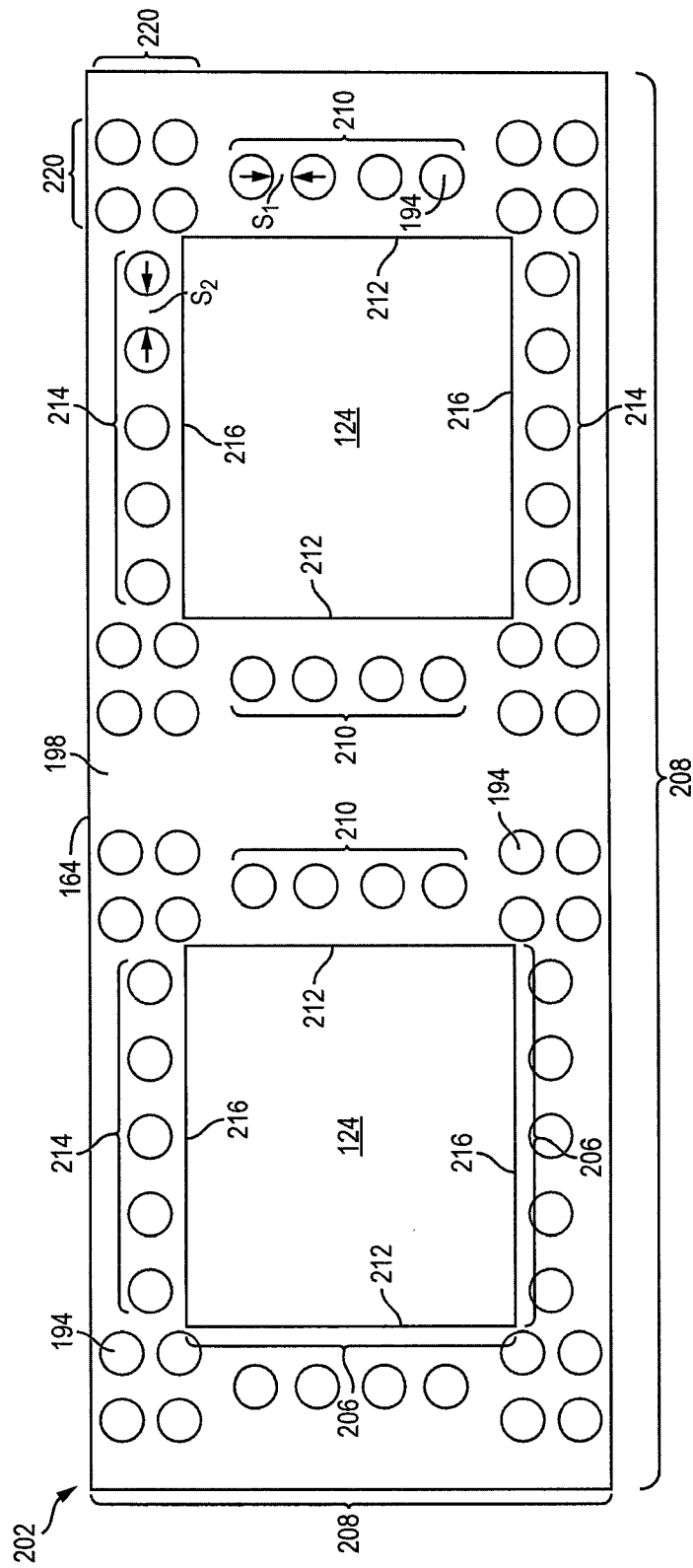

FIG. 4i shows a plan view of reconstituted wafer 202 including semiconductor die 124, encapsulant 164, vias 194, build-up interconnect structure 182, and carrier 184. Reconstituted wafer 202 includes semiconductor die area 206 and peripheral area 208. Semiconductor die area 206 is coextensive with a footprint of semiconductor die 124. Peripheral area 208 extends around semiconductor die area 206 and is outside a footprint of semiconductor die 124. Vias 194 are formed in peripheral area 208 and outside semiconductor die area 206 such that the depth D1 of the vias can be greater than a thickness of encapsulant 164 extending between back surface 128 of semiconductor die 124 and surface 198 of the encapsulant without extending into, or being formed in, semiconductor die 124. Vias 194 are formed with a uniform depth D1 and uniform diameter D4. Alternatively, vias 194 are formed with varying depth D1 and varying diameter D4 according to a desired level of stress or strain relief desired at and around the location of the vias. Vias 194 are formed in one or more rows around and encircling the semiconductor area. A row 210 of vias 194 is offset from opposing sides 212 of semiconductor die 124. Similarly, a row 214 of vias 194 is offset from opposing sides 216 of semiconductor die 124. The location and number of vias 194 varies; and, vias 194 are arranged in rows 210 and 214, which are spaced in groups or patterns that are linear, stochastic, staggered, or even. A number of parallel or staggered rows 210 and 214 can also be offset multiple distances from semiconductor die area 206. In one embodiment, vias 194 are offset a distance greater than or equal to 10 μm. The number of rows 210 and 214 varies and is determined by acceptable stress levels for a final package and can include a first area with a first number of rows and a second area with a second number or rows. FIG. 4i also shows vias 194 in rows 210 and 214 are spaced at distances S1 and S2. In one embodiment, distances S1 and S2 are greater than or equal to a distance of 5 μm.

A group of vias 220 is formed as an array of vias disposed between, or at the juncture of, rows 210 and 214. Groups of vias 220 are diagonally offset from corners of semiconductor die 124 at the intersection of sides 212 and 216. Groups of vias 220 provide a concentration or density of vias 194 in surface 198 of encapsulant 164 higher than a concentration of vias 194 disposed in rows 210 and 214 around semiconductor die area 206. The increased concentration of vias 194 in groups of vias 220 produce lower levels of stress and strain in areas of reconstituted wafer 202, which would otherwise be exposed to higher levels of stress and strain. Thus, areas subject to greater stress, strain, and higher failure rates during TCoB tests and thermal cycling can be formed with higher concentrations of stress relieving vias 194 to reduce increased levels of stress and strain and reduce a number of package failures.

Figure 4J:
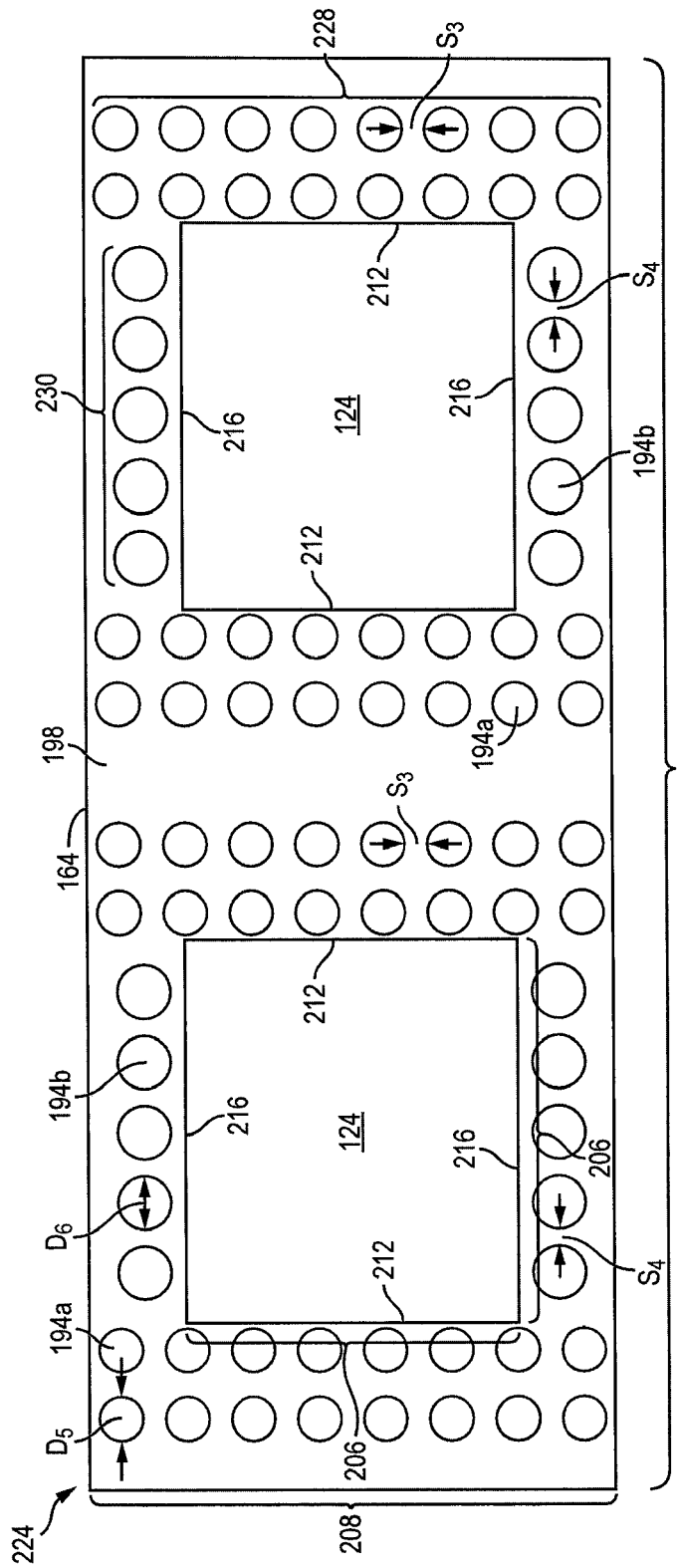

FIG. 4j shows a plan view of reconstituted wafer 224, similar to reconstituted wafer 202 in FIG. 4i. Reconstituted wafer 224 includes semiconductor die 124, encapsulant 164, vias 194a, vias 194b, build-up interconnect structure 182, and carrier 184. Reconstituted wafer 224 includes semiconductor die area 206 and peripheral area 208. Vias 194a and 194b are similar to vias 194 described above, and are formed through encapsulant 164 in peripheral area 208 and outside semiconductor die area 206. Vias 194a and 194b illustrate additional detail of one embodiment of vias 194 in that vias 194a are formed with a first diameter D5, while vias 194b are formed with a second diameter D6 that is different than diameter D5. In one embodiment, diameter D5 of vias 194a is smaller than diameter D6 of vias 194b. Alternatively, diameter D5 of vias 194a is larger than diameter D6 of vias 194b. Vias 194a and 194b are formed in multiple rows around and encircling semiconductor die area 206.

Rows 228 of vias 194a are offset from opposing sides 212 of semiconductor die 124. Similarly, rows 230 of vias 194b are offset from opposing sides 216 of semiconductor die 124. The location and number of vias 194a and 194b varies; and, vias 194a and 194b are arranged in rows 228 and 230, which are spaced in groups or patterns that are linear, stochastic, staggered, or even. Rows 228 and 230 can also be offset multiple distances from semiconductor die area 206. In one embodiment, rows 228 and 230 are offset a distance greater than or equal to 10 µm. FIG. 4j further shows vias 194a in rows 228 are spaced at a distance S3, while vias 194b in rows 230 are spaced at a distance S4. In one embodiment distances S3 and S4 are greater than or equal to 5 µm. The number of rows 228 and 230 varies according to acceptable stress levels for a final package and can include a first area with a first number of rows and a second area with a second number or rows.

Figure 4K:
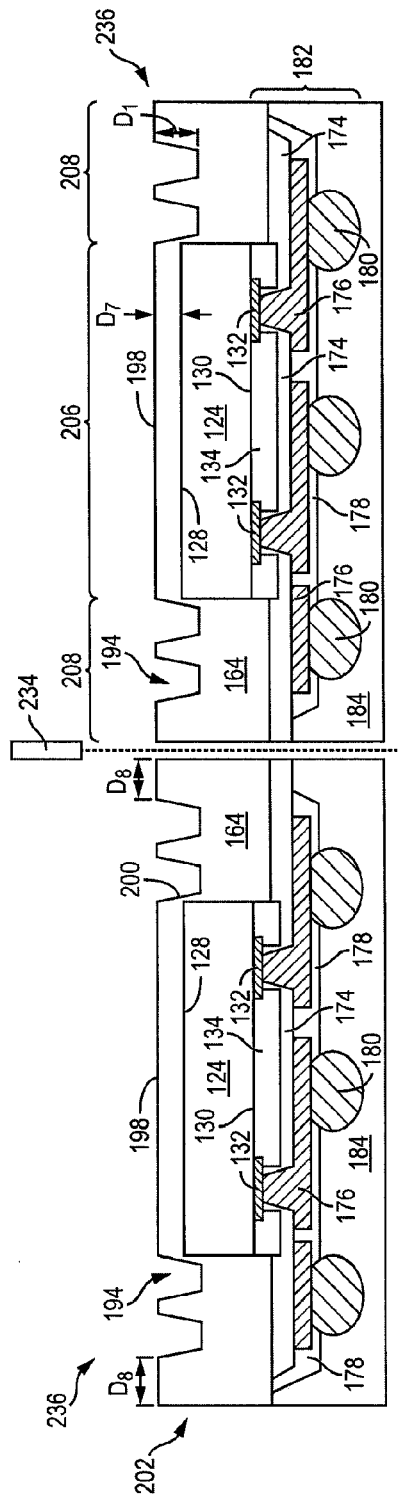

FIG. 4k shows a cross-sectional view of reconstituted wafer 202 from FIG. 4i or reconstituted wafer 224 from FIG. 4j. A number of vias 194 include angled sides that optionally extend over back surface 128 of semiconductor die 124, thereby extending from peripheral area 208 into semiconductor die area 206. Other vias 194 are formed entirely within peripheral area 208. By disposing vias 194 at least partially within peripheral area 208, depth D1 of vias 194 includes a distance greater than a distance or depth of encapsulant D7 that extends between back surface 128 of semiconductor die 124 and surface 198 of encapsulant 164.

FIG. 4k further shows composite substrate 202 is singulated with saw blade or laser cutting device 234 into individual thin fo-WLCSPs 236. Fo-WLCSPs 236 are singulated before carrier 184 is removed by chemical etching, mechanical peeling, CMP, mechanical grinding, thermal bake, UV light, laser scanning, wet stripping, or other suitable process. Alternatively, carrier 184 is removed after formation of vias 194 but before singulation into individual fo-WLCSPs 236.

After singulation of composite substrate 202 into individual thin fo-WLCSPs 236, an edge or outer diameter of vias 194 is disposed a distance D8 from an edge of fo-WLCSP 236. In one embodiment, distance D8 is greater than or equal to 50 µm, and in another embodiment, distance D8 is greater than or equal to 100 µm. By maintaining distance D8 between the edge of fo-WLCSP 236 and the edge of vias 194, fo-WLCSPs 236 can be moved in a pick-and-place operation using a vacuum pick-and-place jig without vias 194 causing a leak in the vacuum used to move fo-WLCSPs 236. Preventing a leak in the vacuum used to move fo-WLCSPs 236 is also affected by the type and dimensions of the pick-and-place jig. Accordingly, the type and dimensions of the pick-and-place jig are also selected based on the configuration of vias 194, available area of fo-WLCSPs 236, and clearance around vias 194 based on distance D8.

Figure 5:
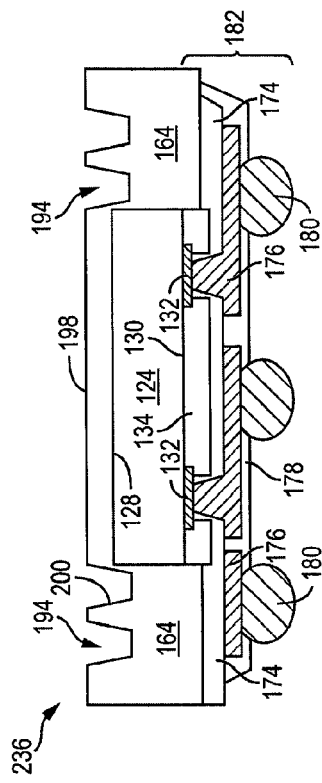
FIG. 5 illustrates an embodiment of a thin fo-WLCSP including stress relieving vias around a semiconductor die.

FIG. 5 shows a cross-sectional view of fo-WLCSP 236 after singulation from reconstituted wafer 202 and after removal of carrier 184. Fo-WLCSP 236 is a thin package that provides fan-out horizontal electrical interconnection for semiconductor die 124 and offers a number of advantages over packages known in the prior art.

The formation of vias 194 through surface 198 of encapsulant 164 provides a reduction of thermal stress resulting from differences in the CTEs of various materials comprising the composite substrate. Vias 194 extend from surface 198 of encapsulant 164 partially, but not completely, through the encapsulant. Vias 194 are disposed at least partially within peripheral area 208 such that a depth of the vias is greater than a distance or depth of encapsulant 164 that extends between back surface 128 of semiconductor die 124 and surface 198 of the encapsulant. In one embodiment, vias 194 are disposed a distance of at least 50-100 µm from an edge of fo-WLCSP 236 to enable fo-WLCSPs 236 to be moved in a pick-and-place operation using a vacuum pick-and-place jig without vias 194 causing a leak in the vacuum. An increased concentration of vias 194 can also be formed in high stress areas of reconstituted wafer 202 to reduce increased levels of stress and strain and reduce a number of package failures. After formation of vias 194, a repair material is optionally disposed over encapsulant 164 and within vias 194 to repair damage to encapsulant 164 resulting from the formation of the vias.

By forming stress relieving vias in encapsulant 164 and around semiconductor die 124, performance of fo-WLCSP 236 during thermal cycling is improved. Thus, stress in composite substrate 170 is reduced by changes in package geometry without changing the CTEs of individual components of the composite substrate. Specifically, the stress in composite substrate 170 is reduced at areas of high stress concentration, including at contact pads 132 and bumps 180, and overall package stress and strain is reduced by a reduction of mass at a backside of composite substrate 170. Furthermore, package performance during TCoB tests is also improved by having a package CTE substantially equal to a CTE of the TCoB test board. As such, changes to both package CTE and package geometry can be incorporated into a single package to improve package performance during TCoB tests, and improve package performance and reliability.

FIG. 6a, continuing from FIG. 4h, shows a cross-sectional view of a reconstituted wafer 238 that includes repair material 240 disposed in vias 194 of reconstituted wafer 202 or 224. Repair material 240 is an ink, paste, polymer, or other suitable material that is applied in vias 194 and partially or completely fills the vias. Repair material 240 has a CTE greater than a CTE of encapsulant 164, including a CTE greater than or equal to 10 ppm/C. In another embodiment, repair material 240 includes a CTE greater than or equal to 50 ppm/C. Repair material 240 is conformally applied to vias 194, and can include a first surface that contacts vias 194 and a second surface opposite the first surface that is parallel or substantially parallel to the first surface. Alternatively, a second or top surface 242 of repair material 240 is coplanar with respect to surface 198 of encapsulant 164. Planar top surface 242 can also be offset or recessed with respect to surface 198 of encapsulant 164. Repair material 240 repairs damage to encapsulant 164 resulting from the formation of vias 194 and provides structural support for preventing the formation and spread of micro-cracks around vias 194. The CTE of repair material 240 is selected to balance warpage of reconstituted wafer 238 and to increase an effective CTE of encapsulant 164, which also increases an effective CTE of the reconstituted wafer and individual semiconductor packages after singulation of the reconstituted wafer. After disposing repair material 240 in vias 194, the repair material undergoes a curing process. In one embodiment, repair material 240 includes a high CTE, e.g., a CTE in a range of 60-300 ppm/K. The CTE of repair material 240 can be selected to improve package performance during TCoB tests and thermal cycling during the life of the package.

FIG. 6b, shows a plan view of reconstituted wafer 238 previously shown in cross sectional view in FIG. 6a. Reconstituted wafer 238 includes semiconductor die 124, encapsulant 164, vias 194, build-up interconnect structure 182, carrier 184, and repair material 240. Reconstituted wafer 238 is similar to reconstituted wafer 202, shown in FIG. 4i, and further includes the additional detail of repair material 240 disposed within vias 194, as described above with respect to FIG. 6a.

Figure 6C:
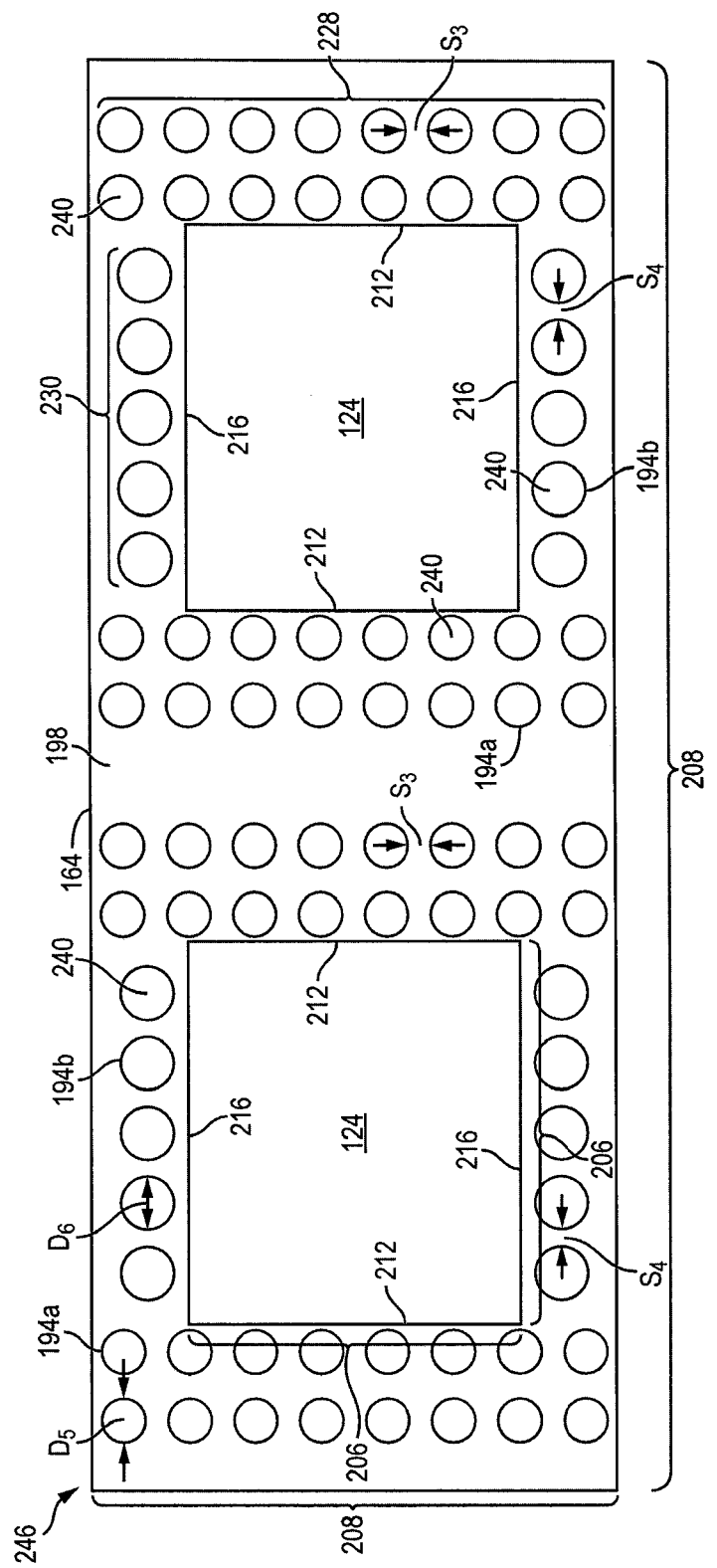

FIG. 6c shows a plan view of a reconstituted wafer 246, similar to reconstituted wafer 238 from FIG. 6b. Reconstituted wafer 246 includes semiconductor die 124, encapsulant 164, vias 194a, vias 194b, build-up interconnect structure 182, carrier 184, and repair material 240. Reconstituted wafer 246 is also similar to reconstituted wafer 224, shown in FIG. 4j, and further includes the additional detail of repair material 240 disposed within vias 194a and 194b, as described above with respect to FIG. 6a.

Figure 6D:
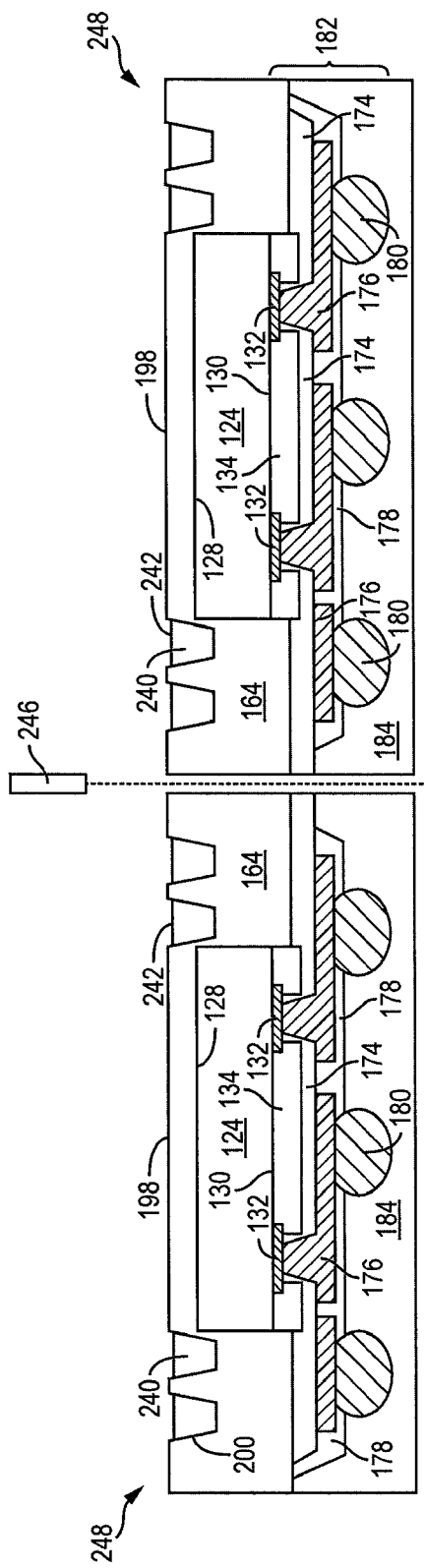

FIG. 6d shows a cross-sectional view of reconstituted wafer 238 from FIG. 6b or reconstituted wafer 246 from FIG. 6c. A number of vias 194 include angled sides that optionally extend over back surface 128 of semiconductor die 124, thereby extending from peripheral area 208 into semiconductor die area 206. Other vias 194 are formed entirely within peripheral area 208. By disposing vias 194 at least partially within peripheral area 208, depth D1 of vias 194 includes a distance greater than a distance or depth of encapsulant D7 that extends between back surface 128 of semiconductor die 124 and surface 198 of encapsulant 164.

FIG. 6d further shows reconstituted wafer 238 or 246 is singulated with saw blade or laser cutting device 246 into individual thin fo-WLCSPs 248. Fo-WLCSPs 248 are singulated before carrier 184 is removed by chemical etching, mechanical peeling, CMP, mechanical grinding, thermal bake, UV light, laser scanning, wet stripping, or other suitable process. Alternatively, carrier 184 is removed after formation of vias 194 but before singulation into individual fo-WLCSPs 248.

After singulation of reconstituted wafer 238 or 246 into individual thin fo-WLCSPs 248, an edge or outer diameter of vias 194 is disposed a distance D8 from an edge of fo-WLCSP 248. In one embodiment, distance D8 is greater than or equal to 50 µm, and in another embodiment, distance D8 is greater than or equal to 100 µm. By maintaining distance D8 between the edge of fo-WLCSP 248 and the edge of vias 194, fo-WLCSPs 248 can be moved in a pick-and-place operation using a vacuum pick-and-place jig without vias 196 causing a leak in the vacuum used to move fo-WLCSPs 248. Preventing a leak in the vacuum used to move fo-WLCSPs 248 is also affected by the type and dimensions of the pick-and-place jig. Accordingly, the type and dimensions of the pick-and-place jig are also selected based on the configuration of vias 194, available area of fo-WLCSPs 248, and clearance around vias 194 based on distance D8.

Figure 7:
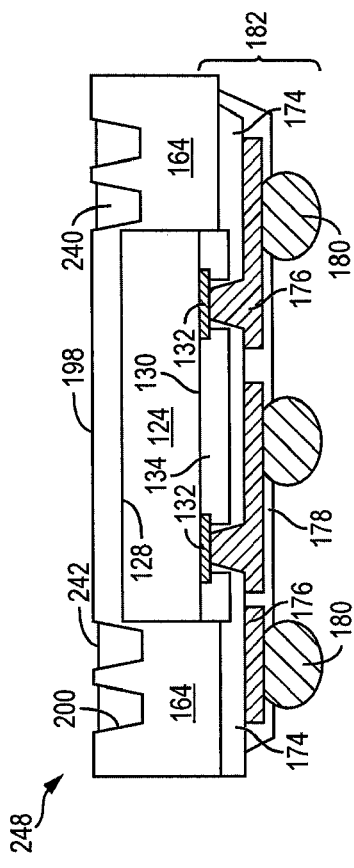
FIG. 7 illustrates an embodiment of a thin fo-WLCSP including stress relieving vias around a semiconductor die and a repair material.

FIG. 7 shows a cross-sectional view of fo-WLCSP 248 after singulation from reconstituted wafer 238 or 246 and after removal of carrier 184. Fo-WLCSP 248 is a thin package that provides fan-out horizontal electrical interconnection for semiconductor die 124 and offers a number of advantages over packages known in the prior art.

Similar to FIG. 5, the formation of vias 194 through surface 198 of encapsulant 164 provides a reduction of thermal stress resulting from differences in the CTEs of various materials comprising the composite substrate. Vias 194 extend from surface 198 of encapsulant 164 partially, but not completely, through the encapsulant. Vias 194 are disposed at least partially within peripheral area 208 such that a depth of the vias is greater than a distance or depth of encapsulant 164 that extends between back surface 128 of semiconductor die 124 and surface 198 of the encapsulant. In one embodiment, vias 194 are disposed a distance of at least 50-100 µm from an edge of fo-WLCSP 248 to enable fo-WLCSPs 248 to be moved in a pick-and-place operation using a vacuum pick-and-place jig without vias 194 causing a leak in the vacuum. An increased concentration of vias 194 can also be formed in high stress areas of reconstituted wafer 238 or 246 to reduce increased levels of stress and strain and reduce a number of package failures. After formation of vias 194, repair material 240 is disposed within vias 194 to repair damage to encapsulant 164 resulting from the formation of the vias.

By forming stress relieving vias in encapsulant 164 and around semiconductor die 124, performance of fo-WLCSP 248 during thermal cycling is improved. Thus, stress in composite substrate 170 is reduced by changes in package geometry without changing the CTEs of individual components of the composite substrate. Specifically, the stress in composite substrate 170 is reduced at areas of high stress concentration, including at contact pads 132 and bumps 180, and overall package stress and strain is reduced by a reduction of mass at a backside of composite substrate 170. Furthermore, package performance during TCoB tests is also improved by having a package CTE substantially equal to a CTE of the TCoB test board. As such, changes to both package CTE and package geometry can be incorporated into a single package to improve package performance during TCoB tests, and improve package performance and reliability.

Figure 8:
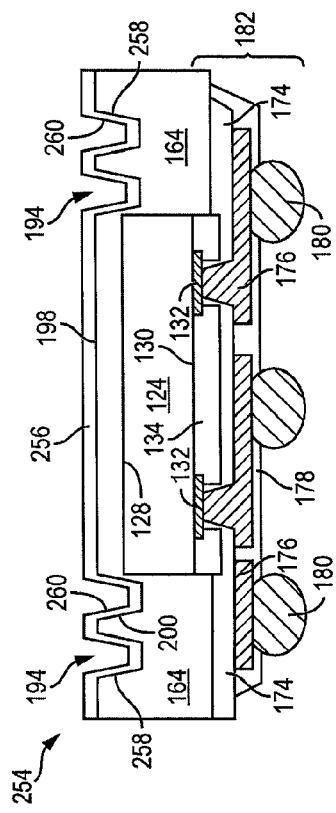
FIG. 8 illustrates another embodiment of a thin fo-WLCSP including stress relieving vias around a semiconductor die and a repair material.

FIG. 8, similar to and continuing from FIG. 4k, shows a cross sectional view of fo-WLCSP 254 after singulation of reconstituted wafer 202 or 224. Prior to singulation of reconstituted wafer 202 or 224, and subsequent to the formation of vias 194, repair material 256 is applied. Repair material 256 is an ink, paste, polymer, or other suitable material that is diluted and sprayed or applied as a split coat over surface 198 and in vias 194. Alternatively, repair material 256 is applied by dipping reconstituted wafer 202 or 224 into the repair material, or by using a roller to apply diluted repair material 256 over surface 198 and in vias 194 while proper protection prevents application of the repair material to portions of the wafer that do not receive the repair material. Repair material 256 has a CTE greater than a CTE of encapsulant 164, including a CTE greater than or equal to 10 ppm/C. In another embodiment, repair material 256 includes a CTE greater than or equal to 50 ppm/C. After application of repair material 256, the repair material is cured. Repair material 256 partially or completely fills vias 194 and extends between the vias across surface 198 to cover semiconductor die area 206 and peripheral area 208. Repair material 256 is conformally applied to vias 194, and can include a first surface 258 that directly contacts vias 194 and surface 198. A second surface 260 opposite first surface 258 follows the contours of, and is parallel or substantially parallel to, first surface 258. In another embodiment, repair material 256 completely fills vias 194 such that surface 260 of repair material 256 is planar and extends between vias 194 over surface 198 of encapsulant 164. Repair material 256 repairs damage to encapsulant 164 resulting from the formation of vias 194 and provides structural support for preventing the formation and spread of micro-cracks around vias 194. The CTE of repair material 256 is selected to increase an effective CTE of encapsulant 164 and to balance warpage of fo-WLCSP 254. In one embodiment, repair material 256 includes a high CTE, e.g., a CTE in a range of 60-300 ppm/K. The CTE of repair material 256 can be selected to improve package performance during TCoB tests and thermal cycling during the life of the package.

Figure 9A:
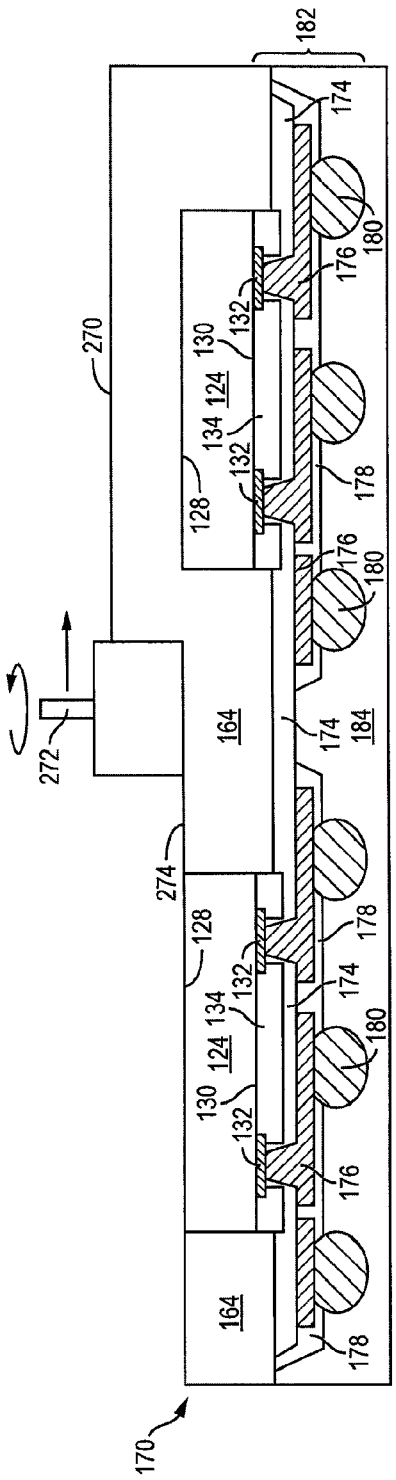

FIG. 9a, continuing from FIG. 4f, shows surface 270 of encapsulant 164 opposite interconnect structure 182 undergoes an optional grinding operation with grinder 272 to planarize the surface and reduce a thickness of the encapsulant after the formation of interconnect structure 182. Removal of a portion of encapsulant 164 exposes back surface 128 or a back portion of semiconductor die 124. Removal of a portion of encapsulant 164 also exposes surface 274 of encapsulant that is substantially coplanar with back surface 128 or the exposed back portion of semiconductor die 124 opposite interconnect structure 182. Alternatively, when encapsulant 164 is formed around semiconductor die 124, the encapsulant can be formed without covering back surface 128 of the semiconductor die and eliminate the step of removing a portion of the encapsulant to expose back surface 128. When encapsulant 164 does undergo grinding, a chemical etch or CMP process can also be used to remove mechanical damage resulting from the grinding operation and planarize encapsulant 164 as well as back surface 128 or the exposed back portion of semiconductor die 124.

Figure 9B:
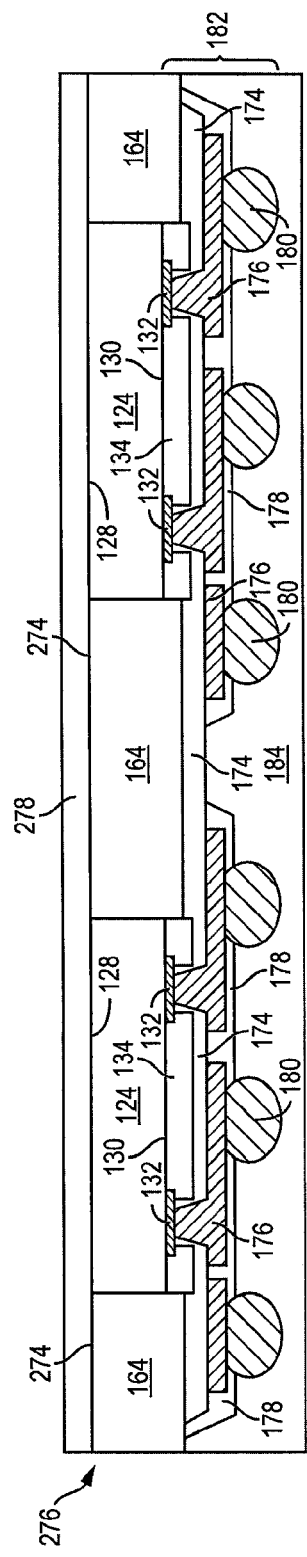

In FIG. 9b, support layer 278 is formed over an entirety of a surface of composite substrate 170, including over surface 274 of encapsulant 164 and back surface 128 of semiconductor die 124 opposite interconnect structure 182 to form reconstituted wafer 276. In another embodiment, support layer 278 is formed opposite interconnect structure 182 before bumps 180 are formed as part of the interconnect structure. Bumps 180 are then formed after the formation of support layer 278. In either event, support layer 278 is deposited using printing, spin coating, spray coating, screen printing, lamination, a paste printing, compressive molding, transfer molding, liquid encapsulant molding, vacuum lamination, or other suitable applicator. Support layer 278 is one or more layers of photosensitive polymer dielectric film with or without fillers, non-photosensitive polymer dielectric film, epoxy, epoxy resin, polymer material, polymer composite material such as epoxy resin with filler, fiber, woven or cross layered glass, epoxy acrylate with filler, fiber, woven or cross layered glass, or polymer with proper filler, thermoset plastic laminate, or other material having similar insulating and structural properties. Support layer 278 is of a substantially uniform thickness, and as such, opposing surfaces of the support layer that contact composite substrate 170 and form an outer surface of reconstituted wafer 276 are substantially parallel.

Support layer 278 is non-conductive, provides physical support and increases package strength, improves and controls overall package warpage, and environmentally protects semiconductor die 124 from external elements and contaminants. Support layer 278 provides structural support for the package, balances stress on the package, and reduces warping or cracking of the package during the life of the package including during subsequent handling and processing. Warpage characteristics of support layer 278, including thickness of the warpage balance layer and material properties, are adjusted according to overall package configuration and design. In one embodiment, support layer 278 has a thickness in a range of 10 to 80 µm and a CTE in a range of 30 to 150 ppm/degree C. at room temperature, or about 24-25 degrees C. Thus, support layer 278 is selected according to the function and design of the final package to have a proper CTE, thickness, mechanical strength, thermal properties, and insulation properties. Adjusting the various attributes of support layer 278 allows for flexibility in protecting back surface 128 of the semiconductor die and in adjusting an effective CTE for the fo-WLCSP as a whole.

Figure 9C:
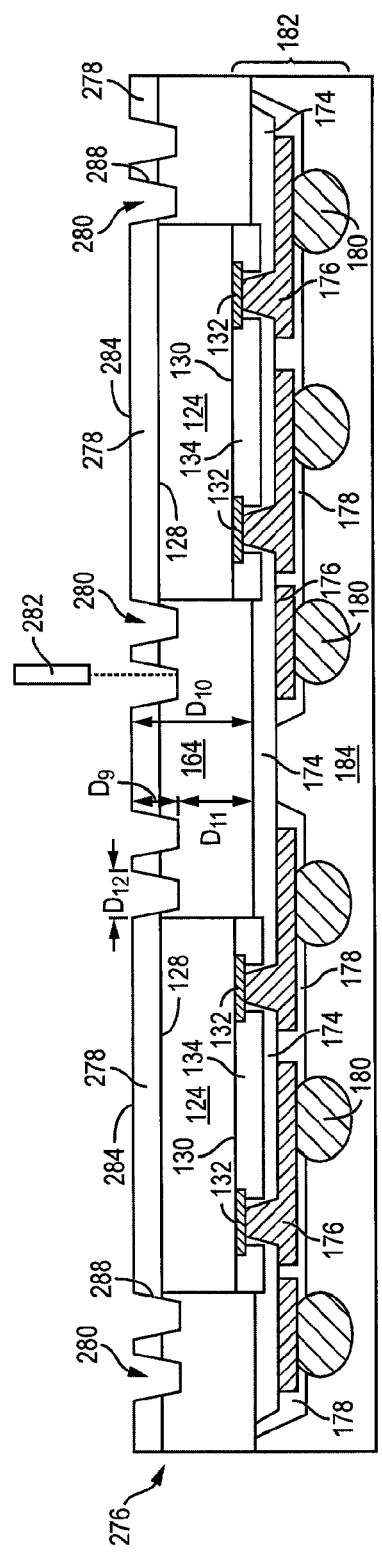

FIG. 9c shows reconstituted wafer 276 after the formation of support layer 278 shown in FIG. 9b. A plurality of vias or openings 280 are formed through support layer 278 and in encapsulant 164 of reconstituted wafer 276 using laser drilling, mechanical drilling, DRIE, wet/dry etching, or other suitable process. In one embodiment, vias 280 are formed by LDA using laser 282. Vias 280 extend from surface 284 of support layer 278 partially, but not completely, through the encapsulant. In other words, vias 280 include a distance or depth D9 that is less than a combined distance or depth D10 of encapsulant 164 and support layer 278. Distance D10 extends from surface 284 of support layer 278 to insulating layer 174 of build-up interconnect structure 182. In one embodiment, a ratio of D9:D10 is less than 4:5 such that distance D9 is less than or equal to eighty percent of a distance of D10. When D9 is less than D10, a distance or thickness of encapsulant D11 equal to a difference between D10 and D9 remains between vias 280 and insulating layer 174 or build-up interconnect structure 182. D11 includes a thickness of at least 1 µm. In one embodiment, vias 280 include a depth D9 greater than a thickness of support layer 278 formed over back surface 128 and less than a thickness of encapsulant 164 or a sum of the thicknesses of support layer 278 and encapsulant 164. Vias 280 further include a diameter or width D12 between via sidewalls 288 in a range of 100-500 µm. Via sidewalls 288 are straight, sloped, or angled such that diameter D12 of vias 280 is constant along the depth D9 or varies along the depth D9 of the vias.

The formation of vias 280 through encapsulant 164 and support layer 278 provides a reduction of stress in reconstituted wafer 276. Stress develops in reconstituted wafer 276 as a result of differences in the CTEs of various materials forming the reconstituted wafer, for example, a CTE of encapsulant 164 and a CTE of semiconductor die 124. Through the formation of support layer 278 and vias 280, a reduction of stress in reconstituted wafer 276 occurs without changing the CTEs of individual components of reconstituted wafer 276, including major body BOMs. Instead, the reduction of stress in reconstituted wafer 276 results from support layer 278 and from redistributing stress concentrations throughout the reconstituted wafer by making changes in package geometry. The formation of vias 280 redistributes stress in reconstituted wafer 276 to reduce stress in areas of high stress concentration, including at contact pads 132 and bumps 180. Overall package stress and strain are also reduced by a reduction of mass at a backside of reconstituted wafer 276, including at an area outside a footprint of semiconductor die 124 over bumps 180 and opposite interconnect structure 182. Reduction of stress and strain in reconstituted wafer 276 improves package performance during TCoB tests, and improves package performance and reliability.

While the formation of vias 280 improves package performance during TCoB tests without changing CTEs of the tested package or the test board, the performance of packages during TCoB tests was negatively affected by a CTE of the package being less than a CTE of the test board. Accordingly, package performance during TCoB tests is improved by having a package CTE equal, or substantially equal, to a CTE of the TCoB test board. Reducing the difference in CTEs between the packages and test board is accomplished by increasing the CTE of the package or decreasing the CTE of the test board. While formation of vias 280 can actually reduce the overall CTE of the package when the CTE of the encapsulant is higher than a CTE of the package as a whole, other adjustments can be made to package materials to reduce the overall CTE of the package. For example, the CTE of the package can be increased by increasing a CTE of the encapsulant or of support layer 278. A CTE of the encapsulant is increased by reducing a quantity of filler mixed with encapsulant 164 for a fixed volume unit when the filler includes a CTE lower than the CTE of the encapsulant. Thus, changes to both package CTE and package geometry can be incorporated into a single package to improve package performance during TCoB tests, and improve package performance and reliability.

After formation of vias 280, the vias can be left unfilled or void of any additional material. Alternatively, as discussed in FIGS. 6a-8, a repair material in the form of an ink, paste, or other suitable material is applied in vias 280 to repair damage to encapsulant 164 or support layer 278 resulting from the formation of the vias. The reduction of stress in reconstituted wafer 276 resulting from the formation of vias 280 through encapsulant 164 and support layer 278 increases package performance and pass rates for packages undergoing a TCoB test. While the challenges of poor performance in TCoB tests vary based on fan-out package design, and are more acute for large packages, package performance during TCoB tests is improved with the formation of vias 280 as described above. The additional cost incurred by the formation of vias 280 is less than, and offset by, the savings realized by increased package quality and reliability resulting from fewer failures related to temperature cycling issues.

Figure 9D:
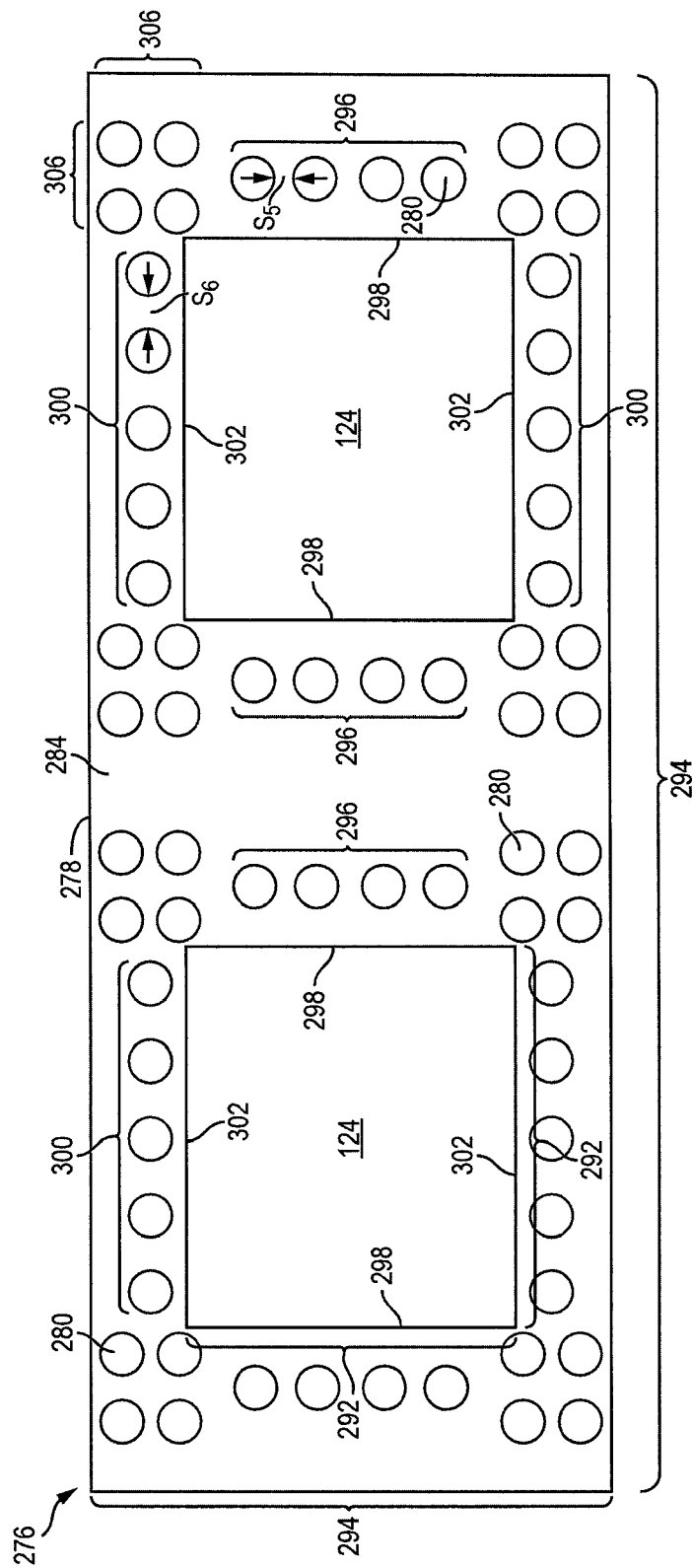

FIG. 9d shows a plan view of reconstituted wafer 276 including semiconductor die 124, encapsulant 164, support layer 278, vias 280, build-up interconnect structure 182, and carrier 184. Reconstituted wafer 276 includes semiconductor die area 292 and peripheral area 294. Semiconductor die area 292 is coextensive with a footprint of semiconductor die 124. Peripheral area 294 extends around semiconductor die area 292 and is outside a footprint of semiconductor die 124. Vias 280 are formed in peripheral area 294 and outside semiconductor die area 292 such that the depth D9 of the vias can be greater than a thickness of support layer 278 that extends between back surface 128 of semiconductor die 124 and surface 284 of the support layer without extending into, or being formed in, semiconductor die 124. Vias 280 are formed with a uniform depth D9 and uniform diameter D12. Alternatively, vias 280 are formed with varying depth D9 and varying diameter D12 according to a desired level of stress or strain relief desired at and around the location of the vias. Vias 280 are formed in one or more rows around and encircling the semiconductor die area. A row 296 of vias 280 is offset from opposing sides 298 of semiconductor die 124. Similarly, a row 300 of vias 280 is offset from opposing sides 302 of semiconductor die 124. The location and number of vias 280 varies; and, vias 280 are arranged in rows 296 and 300 that are spaced in groups or patterns, which are linear, stochastic, staggered, or even. A number of parallel or staggered rows 296 and 300 can also be offset multiple distances from semiconductor die area 292. In one embodiment, vias 280 are offset a distance greater than or equal to 10 µm. The number of rows 296 and 300 varies and is determined by acceptable stress levels for a final package and can include a first area with a first number of rows and a second area with a second number or rows. FIG. 9d also shows vias 280 in rows 296 and 300 are spaced at distances S5 and S6, respectively. In one embodiment, distances S5 and S6 are greater than or equal to a distance of 5 µm.

A group of vias 306 is formed as an array of vias disposed between, or at the juncture of, rows 296 and 300. Groups of vias 306 are diagonally offset from corners of semiconductor die 124 at the intersection of sides 298 and 302. Groups of vias 306 provide a concentration or density of vias 280 in support layer 278 higher than a concentration of vias 280 disposed in rows 296 and 300 around semiconductor die area 292. The increased concentration of vias 280 in groups of vias 306 produce lower levels of stress and strain in areas of reconstituted wafer 276, which would otherwise be exposed to higher levels of stress and strain. Thus, areas subject to greater stress, strain, and higher failure rates during TCoB tests and thermal cycling can be formed with higher concentrations of stress relieving vias 280 to reduce increased levels of stress and strain and reduce a number of package failures.

Figure 9E:
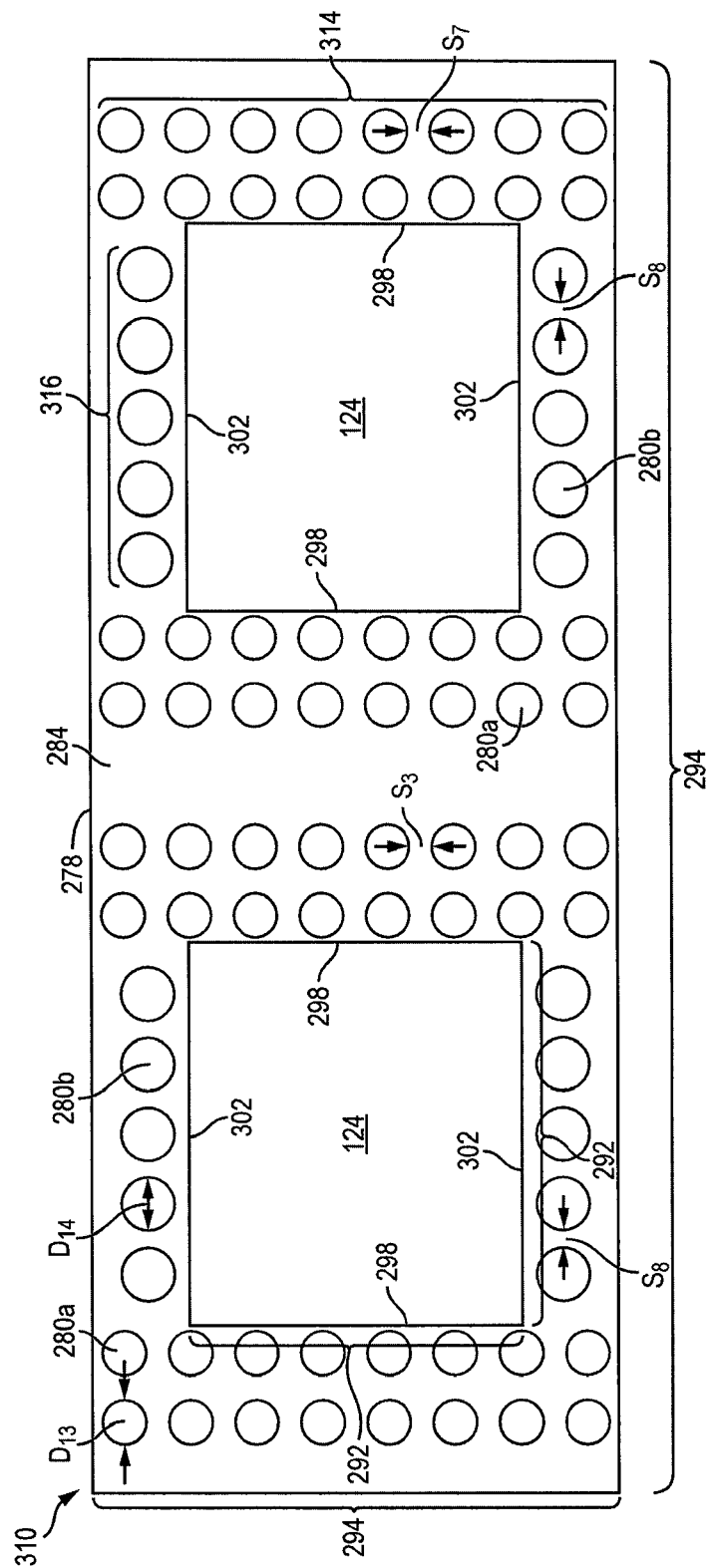

FIG. 9e shows a plan view of reconstituted wafer 310, similar to reconstituted wafer 276 in FIG. 9d. Reconstituted wafer 310 includes semiconductor die 124, encapsulant 164, vias 280a, vias 280b, build-up interconnect structure 182, carrier 184, and support layer 278. Reconstituted wafer 310 includes semiconductor die area 292 and peripheral area 294. Vias 280a and 280b are similar to vias 280 described above, and are formed through encapsulant 164 and support layer 278 in peripheral area 294 and outside semiconductor die area 292. Vias 280a and 280b illustrate additional detail of one embodiment of vias 280 in that vias 280a are formed with a first diameter D13, while vias 280b are formed with a second diameter D14 that is different than diameter D13. In one embodiment, diameter D13 of vias 280a is smaller than diameter D14 of vias 280b. Alternatively, diameter D13 of vias 280a is larger than diameter D14 of vias 280b. Vias 280a and 280b are formed in multiple rows around and encircling semiconductor die area 292.

Rows 314 of vias 280a are offset from opposing sides 298 of semiconductor die 124. Similarly, rows 316 of vias 280b are offset from opposing sides 302 of semiconductor die 124. The location and number of vias 280a and 280b varies; and, vias 280a and 280b are arranged in rows 314 and 316 that are spaced in groups or patterns, which are linear, stochastic, staggered, or even. Rows 314 and 316 can also be offset multiple distances from semiconductor die area 292. In one embodiment, rows 314 and 316 are offset a distance greater than or equal to 10 µm. FIG. 9e further shows vias 280a in rows 314 are spaced at a distance S7, while vias 280b in rows 316 are spaced at a distance S8. In one embodiment, distances S7 and S8 are greater than or equal to 5 µm. The number of rows 314 and 316 varies according to acceptable stress levels for a final package and can include a first area with a first number of rows and a second area with a second number or rows.

FIG. 9f shows a cross-sectional view of reconstituted wafer 276 from FIG. 9d or reconstituted wafer 310 from FIG. 9e. A number of vias 280 include angled sides that optionally extend over back surface 128 of semiconductor die 124, thereby extending from peripheral area 294 into semiconductor die area 292. Other vias 280 are formed entirely within peripheral area 294. By disposing vias 280 at least partially within peripheral area 294, depth D9 of vias 280 includes a distance greater than a distance or depth of encapsulant D15 that extends between back surface 128 of semiconductor die 124 and surface 284 of support layer 278.

FIG. 9f further shows the composite substrate is singulated with saw blade or laser cutting device 320 into individual thin fo-WLCSPs 322. Fo-WLCSPs 322 are singulated before carrier 184 is removed by chemical etching, mechanical peeling, CMP, mechanical grinding, thermal bake, UV light, laser scanning, wet stripping, or other suitable process. Alternatively, carrier 184 is removed after formation of vias 280 but before singulation into individual fo-WLCSPs 322.

After singulation of composite substrate 276 or 310 into individual thin fo-WLCSPs 322, an edge or outer diameter of vias 280 is disposed a distance D16 from an edge of fo-WLCSP 322. In one embodiment, distance D16 is greater than or equal to 50 μm, and in another embodiment, distance D16 is greater than or equal to 100 μm. By maintaining distance D16 between the edge of fo-WLCSP 322 and the edge of vias 280, fo-WLCSPs 322 can be moved in a pick-and-place operation using a vacuum pick-and-place jig without vias 280 causing a leak in the vacuum used to move fo-WLCSPs 322. Preventing a leak in the vacuum used to move fo-WLCSPs 322 is also affected by the type and dimensions of the pick-and-place jig. Accordingly, the type and dimensions of the pick-and-place jig are also selected based on the configuration of vias 280, available area of fo-WLCSPs 322, and clearance around vias 280 based on distance D16.

FIG. 10 shows a cross-sectional view of fo-WLCSP 322 after singulation from reconstituted wafer 276 or 310 and after removal of carrier 184. Fo-WLCSP 322 is a thin package that provides fan-out horizontal electrical interconnection for semiconductor die 124 and offers a number of advantages over packages known in the prior art.

The formation of vias 280 through support layer 278 and in encapsulant 164 provides a reduction of thermal stress resulting from differences in the CTEs of various materials comprising the composite substrate. Support layer 278 is non-conductive, provides physical support and increases package strength, improves and controls overall package warpage, and environmentally protects semiconductor die 124 from external elements and contaminants. Support layer 278 provides structural support for the package, balances stress on the package, and reduces warping or cracking of the package during the life of the package including during subsequent handling and processing. Vias 280 extend from surface 284 of support layer 278 partially, but not completely, through encapsulant 164. Vias 280 are disposed at least partially within peripheral area 294 such that a depth of the vias is greater than a distance or depth of support layer 278 that extends between back surface 128 of semiconductor die 124 and surface 284. In one embodiment, vias 280 are disposed a distance of at least 50-100 μm from an edge of fo-WLCSP 322 to enable fo-WLCSPs 322 to be moved in a pick-and-place operation using a vacuum pick-and-place jig without vias 280 causing a leak in the vacuum. An increased concentration of vias 280 can also be formed in high stress areas of reconstituted wafer 276 or 310 to reduce increased levels of stress and strain and reduce a number of package failures. After formation of vias 280, a repair material is optionally disposed over encapsulant 164 and within vias 280 to repair damage to encapsulant 164 and support layer 278 resulting from the formation of the vias.

By forming stress relieving vias in encapsulant 164 and around semiconductor die 124, performance of fo-WLCSP 322 during thermal cycling is improved. Thus, stress in reconstituted wafer 276 or 310 is reduced by changes in package geometry without changing the CTEs of individual components of the composite substrate. Specifically, the stress in reconstituted wafer 276 or 310 is reduced at areas of high stress concentration, including at contact pads 132 and bumps 180, and overall package stress and strain is reduced by a reduction of mass at a backside of reconstituted wafer 276 or 310. Furthermore, package performance during TCoB tests is also improved by having a package CTE substantially equal to a CTE of the TCoB test board. As such, changes to both package CTE and package geometry can be incorporated into a single package to improve package performance during TCoB tests, and improve package performance and reliability.

FIG. 11a, continuing from FIG. 4g, shows composite substrate 170 and carrier 184 after the backgrinding of encapsulant 164 with grinder 190. Removal of a portion of encapsulant 164 with grinder 190 exposes a planar surface 328 without exposing semiconductor die 124. Planar surface 328 is disposed over, and vertically offset with respect to, back surface 128 of semiconductor die 124 by a distance of D17. In one embodiment, a distance of D17 is greater than or equal to 10 μm. A chemical etch or CMP process can also be used to remove mechanical damage resulting from the grinding operation and to further planarize surface 328 of encapsulant 164.

FIG. 11a additionally shows a second partial backgrinding of encapsulant 164 is performed using instrument 330, which includes a grinder, saw, laser, or other suitable device, to form reconstituted wafer 332. In one embodiment, instrument 330 is a small backgrinding wheel used for removing encapsulant 164 in a peripheral area between adjacent semiconductor die 124. In another embodiment, instrument 330 is a chamfer saw or grinder with a taper wheel. In yet another embodiment, instrument 330 is a laser that removes encapsulant 164 using LDA and without touching semiconductor die 124. In any event, instrument 330 removes a portion of encapsulant 164 in the peripheral area between semiconductor die 124 in a first direction and in a second direction perpendicular to the first direction to form recessed area 334.

The second partial backgrinding removes an additional portion of encapsulant 164 from around, and outside a footprint of, semiconductor die 124 to form a recessed area or channel 334. Recessed area 334 is formed partially but not completely through encapsulant 164 and includes a depth D18 that extends from surface 328 to surface 338, which is disposed over insulating layer 174 of interconnect structure 182. In other words, recessed area 334 includes a depth D18 that is less than a distance or depth D19 of encapsulant 164. Distance D19 of encapsulant 164 extends from surface 328 to insulating layer 174 of build-up interconnect structure 182. When D18 is less than D19, a distance or thickness of encapsulant D20 equal to a difference between D19 and D18 remains between surface 338 and insulating layer 174 or build-up interconnect structure 182. In one embodiment, D20 includes a thickness greater than or equal to 25 μm. Recessed area 334 includes a depth D18 that is greater than a distance of D17 and less than a distance of D19. Recessed area 334 also includes a distance or width that extends between sidewalls 342 and is offset from a footprint of semiconductor die 124. A distance D21 extends between a footprint of semiconductor die 124 and recessed area 334. Distance D21 extends from an edge of the footprint of semiconductor die 124 to sidewalls 342 of recessed area 334 along surface 328 of encapsulant 164. In one embodiment, D21 is greater than or equal to a distance of 10 μm. Sidewalls 342 are straight, sloped, or angled such that distance across recessed area 334 is constant along depth D18 or varies along the depth D18.

Thus, the formation of recessed area 334 provides a thinner profile for a portion of reconstituted wafer 332 without exposing semiconductor die 124.

The formation of recessed area 334 through encapsulant 164 provides a reduction of stress in reconstituted wafer 332. Stress develops in reconstituted wafer 332 as a result of differences in CTE of various materials forming the composite substrate, for example, a CTE of encapsulant 164 and a CTE of semiconductor die 124. Through the formation of recessed area 334, a reduction of stress in reconstituted wafer 332 occurs without changing the CTEs of individual components of the composite substrate, including major body BOMs. Instead, the reduction of stress in reconstituted wafer 332 results from redistributing stress concentrations throughout the composite substrate by changes in package geometry. The formation of recessed area 334 redistributes stress in reconstituted wafer 332 to reduce stress in areas of high stress concentration, including at contact pads 132 and bumps 180. Overall package stress and strain are also reduced by a reduction of mass at a backside of reconstituted wafer 332, including at an area outside a footprint of semiconductor die 124 over bumps 180 and opposite interconnect structure 182. Reduction of stress and strain in reconstituted wafer 332 improves package performance during TCoB tests, and improves package performance and reliability.

While the formation of recessed area 334 improves package performance during TCoB tests without changing CTEs of the tested package or the test board, the performance of packages during TCoB tests was negatively affected by a CTE of the package being less than a CTE of the test board. Accordingly, package performance during TCoB tests is improved by having a package CTE equal, or substantially equal, to a CTE of the TCoB test board. Reducing the difference in CTEs between the packages and test board is accomplished by increasing the CTE of the package or decreasing the CTE of the test board. While formation of recessed area 334 can actually reduce the overall CTE of the package when the CTE of the encapsulant is higher than a CTE of the package as a whole, other adjustments can be made to package materials to reduce the overall CTE of the package. For example, the CTE of the package can be increased by increasing a CTE of the encapsulant, which is accomplished by reducing a quantity of filler mixed with encapsulant 164 for a fixed volume unit when the filler includes a CTE lower than the CTE of the encapsulant. Thus, changes to both package CTE and package geometry can be incorporated into a single package to improve package performance during TCoB tests, and improve package performance and reliability.

FIG. 11b shows a plan view of reconstituted wafer 332 from FIG. 11a and includes semiconductor die 124, encapsulant 164, build-up interconnect structure 182, carrier 184, and recessed area 334. Encapsulant 164 of reconstituted wafer 332 includes surface 328 disposed over semiconductor die 124, and recessed area 334 that includes surface 338 and sidewalls 342. In one embodiment, surface 338 includes a footprint that is larger than a footprint of semiconductor die 124 such that the footprint of the semiconductor die is smaller than, and disposed completely within the footprint of surface 338. When the footprint of surface 338 is larger than a footprint of semiconductor die 124, a portion of sloped sidewall 342 of recessed area 334 is not disposed over semiconductor die 124. Alternatively, the footprint of surface 338 can be equal to or smaller than a footprint of semiconductor die 124. When the footprint of surface 338 is smaller than a footprint of semiconductor die 124, a portion of sloped sidewall 342 of recessed area 334 is disposed over semiconductor die 124. Recessed area 334 is shown disposed in the peripheral area between semiconductor die 124 including a portion or channel that extends in a first direction and another portion or channel that extends a second direction perpendicular to the first direction, such that the first and second portions intersect to form recessed area 334 that extends around an entire perimeter or circumference of semiconductor die 124.

After formation of recessed area 334, the recessed area can be left unfilled or void of any additional material. Alternatively, as discussed in greater detail below, a repair material in the form of an ink, paste, or other suitable material is applied to encapsulant 164 and in recessed area 334 to repair damage to encapsulant 164 resulting from the formation of the recessed area. The reduction of stress in reconstituted wafer 332 resulting from the formation of recessed area 334 increases package performance and pass rates for packages undergoing TCoB tests. While the challenges of poor performance in temperature cycling tests vary based on fan-out package design, and are more acute for large packages, package performance during temperature cycling tests is improved with the formation of recessed area 334 as described above. The additional cost incurred by the formation of recessed area 334 is less than, and offset by, the savings realized by increased package quality and reliability resulting from fewer failures during temperature cycling.

Figure 11C:
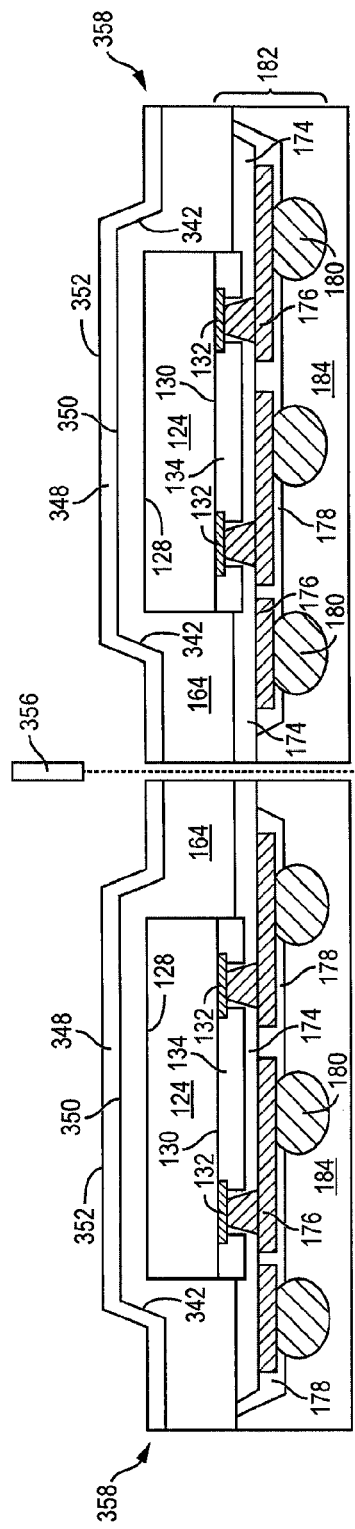

FIG. 11c, continuing from FIG. 11b, shows a cross-sectional view of reconstituted wafer 332 and the formation of repair material 348 over the reconstituted wafer after the formation of recessed area 334. Repair material 348 is an ink, paste, polymer, or other suitable material that is diluted and sprayed or applied as a split coat over surface 328, surface 338, and sidewalls 342. Alternatively, repair material 348 is applied by dipping reconstituted wafer 332 into the repair material, or by using a roller to apply diluted repair material 348 over surfaces 328, 338, and sidewalls 342 while proper protection prevents application of the repair material to portions of the wafer that do not receive the repair material. Repair material 348 is applied before the removal of carrier 184, or alternatively, the repair material is applied after the removal of carrier 184. After application of repair material 348, the repair material is cured.

Repair material 348 partially or completely fills recessed area 334 and extends between the recessed areas across surface 328 to cover the footprint of semiconductor die 124. Repair material 348 is conformally applied to recessed area 334, and includes a first surface 350 that directly contacts surface 328, surface 338, and sidewalls 342. A second surface 352 opposite first surface 350 follows the contours of, and is parallel or substantially parallel to, first surface 350. Repair material 348 repairs damage to encapsulant 164 resulting from the formation of recessed area 334 and provides structural support for preventing the formation and spread of micro-cracks in encapsulant 164 around recessed area 334. In one embodiment, repair material 348 includes a high CTE, e.g., a CTE in a range of 60-300 ppm/K. The CTE of repair material 348 can be selected to improve package performance during TCoB tests and thermal cycling during the life of the package. Additionally, repair material 348 also provides physical support, increases package strength, balances stress on the package, and reduces warping or cracking of the package during the life of the package including during subsequent handling and processing. Warpage characteristics of repair material 348, including thickness and material properties of the repair material, are adjusted according to overall package configuration and design.

FIG. 11c further shows reconstituted wafer 332 is singulated with saw blade or laser cutting device 356 into individual thin fo-WLCSPs 358. Fo-WLCSPs 358 are singulated before carrier 184 is removed by chemical etching, mechanical peeling, CMP, mechanical grinding, thermal bake, UV light, laser scanning, wet stripping, or other suitable process. Alternatively, carrier 184 is removed after formation of recessed area 334 and repair material 348 but before singulation into individual fo-WLCSPs 358.

Figure 12:
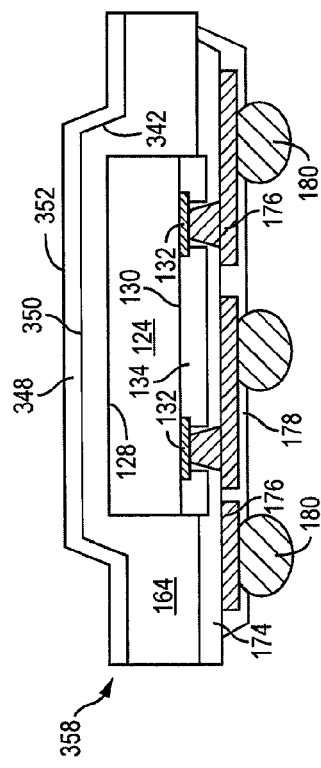
FIG. 12 illustrates an embodiment of a thin fo-WLCSP including a recessed area disposed around a semiconductor die and a support layer.

FIG. 12 shows a cross-sectional view of fo-WLCSP 358 after singulation from reconstituted wafer 332 and after removal of carrier 184. Fo-WLCSP 358 is a thin package that provides fan-out horizontal electrical interconnection for semiconductor die 124 and offers a number of advantages over packages known in the prior art.

The formation of recessed area 334 in encapsulant 164 provides a reduction of thermal stress resulting from differences in the CTEs of various materials comprising the composite substrate. Recessed area 334 extends from surface 328 of encapsulant 164 partially, but not completely, through the encapsulant. Recessed area 334 is disposed such that a depth of the recessed area is greater than a distance or depth of encapsulant 164 that extends between back surface 128 of semiconductor die 124 and surface 328 of the encapsulant. After formation of recessed area 334, a repair material 348 is optionally disposed over encapsulant 164 and within recessed area 334 to repair damage to encapsulant 164 resulting from the formation of the recessed area.

By forming stress relieving recessed area 334 in encapsulant 164 and around semiconductor die 124, performance of fo-WLCSP 358 during thermal cycling is improved. Thus, stress in reconstituted wafer 332 is reduced by changes in package geometry without changing the CTEs of individual components of the reconstituted wafer. Specifically, the stress in reconstituted wafer 332 is reduced at areas of high stress concentration, including at contact pads 132 and bumps 180, and overall package stress and strain is reduced by a reduction of mass at a backside of reconstituted wafer 332. Furthermore, package performance during TCoB tests is also improved by having a package CTE substantially equal to a CTE of the TCoB test board. As such, changes to both package CTE and package geometry can be incorporated into a single package to improve package performance during TCoB tests, and improve package performance and reliability.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die;
an encapsulant disposed over the semiconductor die and physically contacting a first surface of the semiconductor die;
an interconnect structure formed over a first surface of the encapsulant and over an active surface of the semiconductor die opposite the first surface of the semiconductor die; and
a plurality of vias formed partially through a second surface of the encapsulant opposite the first surface of the encapsulant with a portion of the encapsulant remaining between the vias and the first surface of the encapsulant, wherein a first area of the second surface of the encapsulant at a corner of the semiconductor device includes a greater number of the vias than a second area of the second surface of the encapsulant equal in size to the first area, the second area extending from a side surface of the semiconductor die to an edge of the semiconductor device.

2. The semiconductor device of claim 1, wherein a depth of the vias is greater than a distance between the first surface of the semiconductor die and the second surface of the encapsulant.

3. The semiconductor device of claim 1, wherein a depth of a first via of the plurality of vias is different from a depth of a second via of the plurality of vias.

4. The semiconductor device of claim 1, wherein a diameter of a first via of the plurality of vias is 100-500 micrometers.

5. The semiconductor device of claim 1, wherein a diameter of a first via of the plurality of vias is different from a diameter of a second via of the plurality of vias.

6. A semiconductor device, comprising:
a semiconductor die;
an encapsulant disposed around the semiconductor die;
a plurality of vias formed through a first surface of the encapsulant with a first portion of the encapsulant remaining between the vias and a second surface of the encapsulant opposite the first surface of the encapsulant, wherein a first area of the encapsulant at a corner of the semiconductor device includes a greater number of the vias than a second area of the encapsulant equal in size to the first area and located between a side surface of the semiconductor die and an edge of the semiconductor device; and
a conductive layer formed over the second surface of the encapsulant and a first surface of the semiconductor die.

7. The semiconductor device of claim 6, wherein:
a second portion of the encapsulant is disposed over a second surface of the semiconductor die opposite the first surface of the semiconductor die; and
a depth of the vias is greater than a thickness of the second portion of the encapsulant.

8. The semiconductor device of claim 6, wherein:
a depth (D1) of the vias is less than a distance (D2) extending from the first surface of the encapsulant to the second surface of the encapsulant; and
a ratio of D1:D2 is less than or equal to 4:5.

9. The semiconductor device of claim 6, further including a repair material disposed within the vias.

10. The semiconductor device of claim 9, wherein a surface of the repair material is recessed below or coplanar with the first surface of the encapsulant.

11. The semiconductor device of claim 6, further including a support layer comprising an insulating material disposed over the semiconductor die and encapsulant.

12. The semiconductor device of claim 11, wherein the vias are formed through the support layer.

13. A semiconductor device, comprising:
a semiconductor die;
an encapsulant disposed around the semiconductor die;
a plurality of vias formed in a first surface of the encapsulant with a first portion of the encapsulant disposed between the vias and a second surface of the encapsulant opposite the first surface of the encapsulant; and
a repair material disposed in the vias and physically contacting the encapsulant along a sidewall of the vias.

14. The semiconductor device of claim 13, further including an interconnect structure formed over the semiconductor die and encapsulant.

15. The semiconductor device of claim 13, wherein the vias are formed in a row offset from a side surface of the semiconductor die.

16. The semiconductor device of claim 13, wherein a surface of the repair material is coplanar with or recessed below the first surface of the encapsulant.

17. The semiconductor device of claim 13, further including a support layer comprising an insulating material disposed over the semiconductor die and encapsulant.

18. The semiconductor device of claim 17, wherein the vias are formed through the support layer.

19. The semiconductor device of claim 13, wherein a density of a first group of the vias at a corner of the semiconductor device is greater than a density of a second group of the vias offset from a side surface of the semiconductor die.

20. The semiconductor device of claim 13, wherein the vias are formed offset from a corner of the semiconductor die.

21. The semiconductor device of claim 13, wherein a second portion of the encapsulant is disposed over a surface of the semiconductor die and a depth of the vias is greater than a distance between the surface of the semiconductor die and the first surface of the encapsulant.

* * * * *